United States Patent
Hunton

(10) Patent No.: US 6,931,240 B2
(45) Date of Patent: Aug. 16, 2005

(54) SYSTEM AND METHOD FOR ELIMINATING SIGNAL ZERO CROSSINGS IN SINGLE AND MULTIPLE CHANNEL COMMUNICATION SYSTEMS

(75) Inventor: Matthew J. Hunton, Liberty Lake, WA (US)

(73) Assignee: Powerwave Technologies, Inc., Santa Clara, CA (US)

( * ) Notice: Subject to any disclaimer, the term of this patent is extended or adjusted under 35 U.S.C. 154(b) by 65 days.

(21) Appl. No.: 10/391,168

(22) Filed: Mar. 18, 2003

(65) Prior Publication Data

US 2004/0198414 A1 Oct. 7, 2004

Related U.S. Application Data

(60) Provisional application No. 60/365,736, filed on Mar. 19, 2002.

(51) Int. Cl.[7] .................................................. H04B 1/18
(52) U.S. Cl. ..................... 455/130; 455/150.1; 375/295
(58) Field of Search ............................... 455/130, 150.1, 455/226.1, 550, 116, 91, 76, 114.1, 114.2, 114.3, 323, 126; 375/295–297, 147

(56) References Cited

U.S. PATENT DOCUMENTS

| | | | |
|---|---|---|---|
| 4,004,235 A | | 1/1977 | Roberts |
| 4,013,961 A | * | 3/1977 | Colebourn ................... 455/116 |
| 4,219,890 A | * | 8/1980 | Sugihara ..................... 375/345 |
| 4,281,412 A | | 7/1981 | Wissel et al. |
| 4,543,600 A | | 9/1985 | Bolger |
| 4,556,983 A | * | 12/1985 | Heitmann et al. .......... 375/296 |
| 4,707,841 A | | 11/1987 | Yen et al. |
| 4,926,245 A | | 5/1990 | Ueno et al. |
| 5,152,007 A | * | 9/1992 | Uribe ......................... 455/116 |
| 5,696,794 A | | 12/1997 | O'Dea |
| 5,771,263 A | | 6/1998 | Kanazawa et al. |
| 5,805,640 A | | 9/1998 | O'Dea et al. |
| 5,896,561 A | * | 4/1999 | Schrader et al. .......... 455/67.11 |
| 5,966,644 A | * | 10/1999 | Suzuki ......................... 455/76 |
| 6,029,285 A | * | 2/2000 | Belcher et al. ........... 455/114.3 |
| 6,266,517 B1 | * | 7/2001 | Fitzpatrick et al. ...... 455/114.3 |
| 6,504,878 B1 | * | 1/2003 | Sparano ...................... 375/297 |
| 6,570,914 B1 | * | 5/2003 | Ichihara ...................... 375/296 |
| 2003/0109240 A1 | * | 6/2003 | Zipper ........................ 455/323 |
| 2003/0142733 A1 | * | 7/2003 | Boloorian ................... 375/147 |
| 2003/0220084 A1 | * | 11/2003 | Makarov ................... 455/226.1 |

FOREIGN PATENT DOCUMENTS

GB          0441579 B1  *  8/1991   ............ H03C/1/06

* cited by examiner

*Primary Examiner*—Edward F. Urban
*Assistant Examiner*—Lana Le
(74) *Attorney, Agent, or Firm*—Myers Dawes Andras & Sherman LLP

(57) ABSTRACT

A system and method for reducing or eliminating signal amplitudes near or crossing zero is disclosed. Communication systems and methods employing a single carrier or multiple carriers and employing reduction of signal amplitudes near or crossing zero are also disclosed. Communication systems and methods using envelope elimination and restoration amplification and reduction of amplitudes near or crossing zero are also disclosed.

36 Claims, 16 Drawing Sheets

SYSTEM AND METHOD FOR ELIMINATING SIGNAL ZERO CROSSINGS IN SINGLE AND MULTIPLE CHANNEL COMMUNICATION SYSTEMS

RELATED APPLICATION

The present application is related to U.S. Provisional Patent Application No. 60/365,736 filed on Mar. 19, 2002, to which priority is claimed pursuant to 35 USC 119.

BACKGROUND OF THE INVENTION

1. Field of the Invention

The present invention relates to wireless communication systems and signal processing apparatus employed in wireless communication systems. The term 'wireless communication systems' includes cellular communication systems, personal communication systems (PCS), wireless local loop systems, and all other like systems.

2. Background of the Prior Art and Related Information

Wireless communication systems employing transmission between base stations and remote users are a key component of the modern communications infrastructure. These communication systems are being placed under increasing performance demands which are taxing the capability of available equipment, especially wireless base station equipment. These increasing performance demands are due to both the increasing numbers of users within a given wireless region, as well as the bandwidth requirements allocated to wireless system service providers. The increasing number of wireless users is of course readily apparent and this trend is unlikely to slow due to the convenience of wireless services. The second consideration is largely due to the increased types of functionality provided by wireless systems, such as wireless Internet access and other forms of wireless data transfer over such systems. These considerations have resulted in a need for more communication channels per transmit carrier and more transmit carriers operating from each transmitting location of a wireless service network.

There are several methods for creating multiple communication channels on a single carrier. These methods include code division multiple access (CDMA), time division multiple access (TDMA), as well as others. In each of these methods, several data channels enter a signal generator that combines the input data channels using one or more of the methods mentioned above to produce a complex signal output. FIG. 1 shows such a single carrier communication system having multiple user channels. The system has a signal generator 1 receiving plural user data channels $D_1 \ldots D_n$ and producing a complex pair of signal outputs labeled $V_1$ and $V_2$. These signal outputs are then filtered 2, digital to analog converted (DAC) 5, RF up conversion modulated 6, amplified 7, and transmitted 8. The filter 2 used in this process performs two important functions. First, the filter limits the bandwidth of the signal exiting the signal generator. The bandwidth of transmission is regulated by government requirements. Second, the filter impulse response determines the trajectory of the signal waveform. The signal trajectory is an important part of the signal modulation format and is used to reduce interference in signal reception.

A key drawback of the signal generation and transmission method given in FIG. 1 is power amplifier efficiency. In such communication systems, the efficiency of the amplifier 7 must be reduced to achieve good linearity. Without good linearity the spectral bandwidth of the transmit signal would be increased during amplification. Excessive increase in signal bandwidth may cause the transmit signal to exceed the government regulated limits.

To improve efficiency in transmission the transmitter shown in FIG. 2 was developed. This transmitter includes the signal generator 1 and filter 2 of FIG. 1 but then uses a method known as envelope elimination and restoration to produce the transmit signal exiting the power amplifier 7. The first step in envelope elimination and restoration is to convert the transmit signal from rectangular coordinates to polar coordinates. The rectangular to polar coordinate converter 11 produces two outputs based on the two rectangular coordinate inputs provided by the filter 2. The first output represents the signal envelope or signal gain. The second output represents the signal normalized to the signal envelope or the signal phase. Each time sample of the phase signal output is a unity amplitude phasor at a phase angle determined by the instantaneous phase of the modulated signal output from filter 2. The phase component is then digital to analog converted (DAC) 5, RF up conversion modulated 6, and power amplified 7. An alternative to this method would have the phase signal output from the rectangular to polar converter 11 represent the derivative with respect to time (frequency) of the instantaneous phase of the modulated signal output from the filter 2. This alternate signal would then be digital to analog converted (DAC) 5, and converted to a RF signal by application to a voltage controlled oscillator 6, and power amplified 7. Since the signal amplified by the power amplifier contains no amplitude information the linearity of the power amplifier is not a consideration. The power amplifier can therefore be designed for high efficiency. To restore the envelope to the transmitted signal the gain component is digital to analog converted (DAC) 12, and provided to a power supply modulator 13 that provides source power to the power amplifier. The signal envelope therefore controls the gain of the amplifier. The rectangular to polar coordinate converter 11 eliminates the signal envelope and the power supply modulator provides envelope restoration.

To achieve accurate signal generation using envelope elimination and restoration one key limitation is generally placed on the transmit signal. This limitation is that transmit signal amplitude does not approach near or cross zero signal amplitude. If the signal amplitude approaches near or crosses zero amplitude the gain of the transmit amplifier must be set very low or to zero by the supply modulator. Low or zero gain settings mean that the dynamic range of the supply modulator measured in decibels must be very large. Large dynamic range modulators that maintain accurate signal level are difficult to construct. In addition, when approaching very near or crossing zero amplitude the phase component of the signal will be changing very rapidly or instantaneously. This causes the bandwidth of the phase component to be very broad. High bandwidths increase the required signal processing sample rates and the cost of components found in the phase signal path. Fortunately, when generating single carriers for transmit several modulation formats exist, and others can be easily determined, where the signal amplitude does not approach near or cross zero. For such systems, transmit signal generation is often performed using envelope elimination and restoration.

As mentioned above however, increasing user demand is requiring greater numbers of communication channels per transmit carrier. To increase the number of communication channels per transmit carrier transmit signal modulation formats without restriction on signal amplitude variation have been selected. Spread spectrum modulation formats such as code division multiple access (CDMA) and orthogonal coded time division multiple access are examples of transmission formats without limitation on amplitude variation.

Also mentioned above, increasing user demand is requiring the transmission of several transmit carriers from one location. When combining transmit carriers, the signal amplitude of the combined carriers will vary without limit due to the phase combination of multiple carriers at different frequencies. The selection of modulation format cannot eliminate small or zero crossing amplitudes of the multiple carriers. FIG. 3 shows current methods of combining multiple carriers with each carrier composed of one or more communication channels. FIG. 3 shows that after filtering 2 each carrier is offset in frequency 3, combined 4, analog to digital converted (DAC) 5 modulated 6, power amplified 7 and transmitted 8. Envelope elimination and restoration techniques are generally not used in such prior art communication systems due to the combined signal zero crossings.

Accordingly, a need presently exists for a solution to the problems associated with signals crossing or approaching zero in wireless communication systems.

SUMMARY OF THE INVENTION

In a first aspect the present invention provides a wireless communication system comprising a communication signal source providing a modulated communication signal having signal amplitudes and trajectories varying so as to cross below a predetermined amplitude in a random manner. A zero crossing reduction circuit is provided which receives the modulated communication signal and reduces or eliminates signal amplitudes and trajectories crossing below a predetermined amplitude. The zero crossing reduction circuit provides a modified communication signal, having signal amplitudes and trajectories which cross below a predetermined amplitude reduced or eliminated, to a power amplifier which receives and amplifies the modified communication signal. A transmitter receives and transmits the amplified modified communication signal.

The modulated communication signal may comprise a plurality of separate user channels combined together resulting in a modulated communication signal having signal amplitudes and trajectories varying so as to cross below a predetermined amplitude in a random manner. For example, the communication signal source may be a multi-carrier communication signal source and/or a spread spectrum communication signal source. In particular, for such a spread spectrum application the modulated communication signal may comprise a CDMA signal. The modulated communication signal and the modified communication signal may comprise streams of signal samples and the communication system may further comprise a digital-to-analog converter, coupled between the zero crossing reduction circuit and the amplifier, for converting the modified communication signal to an analog signal.

In another aspect the present invention provides a zero crossing reduction unit adapted for use in a communication system. The zero crossing reduction unit comprises a first signal path receiving a modulated input signal having signal amplitudes and trajectories varying so as to cross below a predetermined amplitude in a random manner. The first signal path includes a delay circuit for delaying the input signal. The zero crossing reduction unit also comprises a second parallel signal path receiving the input signal and including a correction calculation unit for calculating a correction for signal amplitudes and trajectories crossing below a predetermined amplitude. The zero crossing reduction unit also comprises a combiner which combines the correction and the delayed input signal and provides an adjusted output signal in which signal amplitudes and trajectories which cross below a predetermined amplitude are reduced or eliminated.

In a preferred embodiment of the zero crossing reduction unit the correction calculation unit may comprise a signal amplitude adjuster that calculates additive signal corrections to move signal amplitudes less than a predetermined limit value to the limit value and a signal trajectory adjuster that calculates additional additive signal corrections to adjust signal amplitudes such that signal trajectories do not pass through the limit value. The signal amplitude adjuster may comprise a signal magnitude detector, a comparator for comparing the signal magnitude to a predetermined limit value and a switch coupled to the output of the comparator and the correction calculation unit for providing the correction to the combiner if the signal magnitude is less than the predetermined limit value. The signal trajectory adjuster preferably operates to first identify signal pairs connected with trajectories which pass below a predetermined limit value and then calculates additive corrections to the signal pairs such that the signal trajectories no longer pass below the limit value. For example, the input signal may comprise digital samples represented by complex vectors and the signal amplitude adjuster may comprise a first processor which performs a complex vector calculation on the input samples to determine a complex correction vector which when added to the input sample results in a signal amplitude at or outside the predetermined limit value. The signal trajectory adjuster may comprise a second processor which performs a complex vector calculation on the input samples to determine a complex correction vector which when added to the input sample results in a signal trajectory which does not pass through the predetermined limit value.

The second signal path may further comprise a correction filter coupled before the combiner and providing a filtering operation on the correction prior to combining with the delayed input signal. For example, the input signal may be band limited and the correction filter provides a filtering operation limiting the correction signal to a frequency band equivalent to the spectral band of the band limited input signal. Alternatively, the second signal path may comprise a plurality of correction filters in parallel coupled before the combiner and providing a plurality of different filtering operations on the correction prior to combining with the delayed input signal. For example, the input signal may be a multiple carrier signal limited to plural frequency bands and each of the plurality of correction filters provides a filtering operation limiting the correction signal to a frequency band equivalent to the spectral band of one carrier. The second signal path may further comprise a gain circuit for adjusting the amplitude of the correction by a gain value. Alternatively, the second signal path may further comprise a plurality of gain circuits coupled to respective correction filter paths for adjusting the amplitude of the correction by a plurality of different gain values.

In another aspect the present invention provides a method for adjusting signal amplitudes and trajectories below a predetermined limit value. The method comprises receiving a modulated input communication signal having signal amplitudes and trajectories which vary below a predetermined limit value, determining the amplitude of the input communication signal, and adjusting input signals having an amplitude less than a predetermined value and providing an amplitude adjusted signal having signal amplitudes less than the predetermined value reduced or eliminated. The method further comprises determining the trajectory of the amplitude adjusted signal and adjusting the amplitude adjusted signals having trajectories less than a predetermined value such that signal trajectories less than the predetermined value are reduced or eliminated.

In yet another aspect the present invention provides an envelope elimination and restoration amplifier system. The envelope elimination and restoration amplifier system comprises an input for receiving a modulated input communication signal having signal amplitudes and trajectories below a predetermined limit value. The envelope elimination and restoration amplifier system further comprises a zero crossing reduction unit receiving the modulated input communication signal and modifying signal amplitudes and trajectories below a predetermined limit value and providing a modified communication signal with signal amplitudes and trajectories below a predetermined limit value reduced or eliminated. The envelope elimination and restoration amplifier system further comprises an envelope elimination circuit for receiving the modified communication signal and converting the modified communication signal to separate gain and phase components and a power amplifier having a signal input receiving the phase component signal and a power supply input receiving the gain component signal.

In yet another aspect the present invention provides a method for amplifying a modulated communication signal having signal amplitudes and trajectories varying below a predetermined limit value. The method comprises receiving a communication signal having signal amplitudes and trajectories varying below a predetermined limit value and adjusting signal amplitudes and trajectories of the modulated communication signal which are below a predetermined limit value to provide a modified communication signal having signal amplitudes and trajectories varying below a predetermined limit value reduced or eliminated. The method further comprises converting the modified communication signal to separate gain and phase components, frequency converting the phase components to provide a phase modulated carrier signal, and amplifying the phase modulated carrier signal with a variable gain controlled by the gain component.

Further features and aspects of the present invention will be appreciated by review of the following detailed description of the invention.

DETAILED DESCRIPTION OF THE INVENTION

Figure 1:
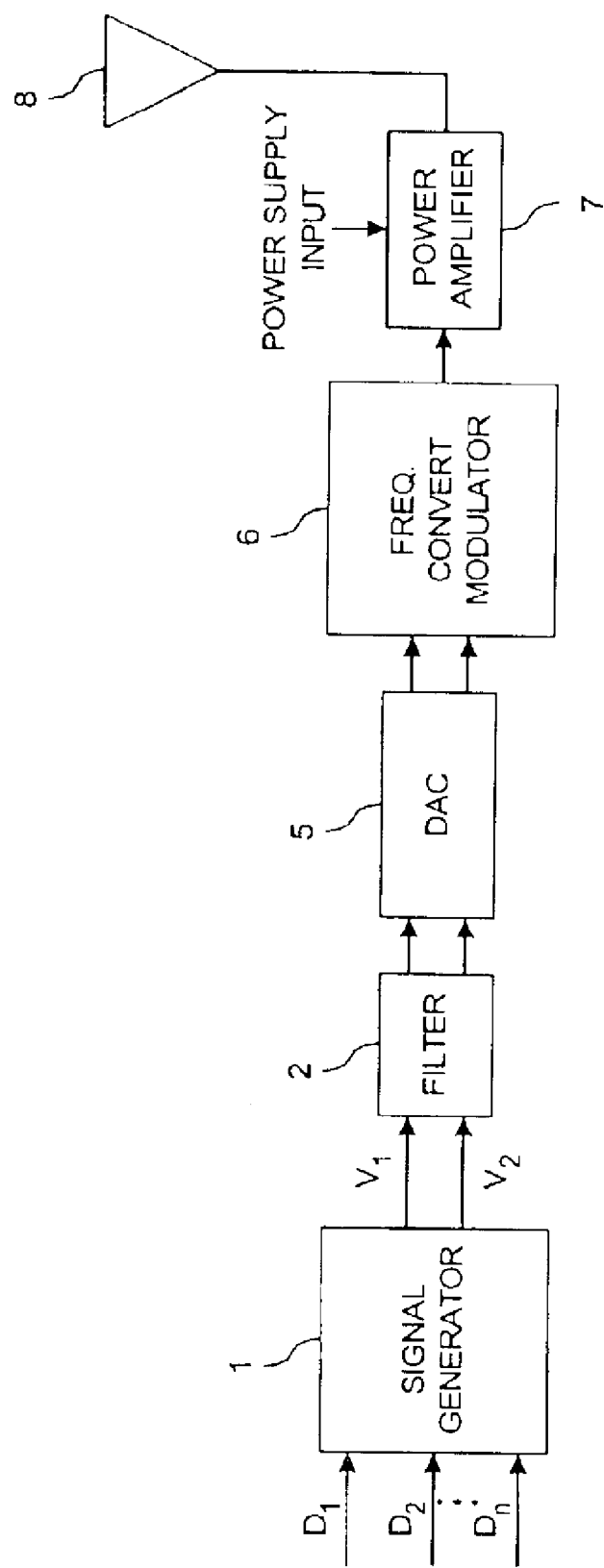
FIG. 1 is a block schematic drawing of a prior art single carrier communication system.
Figure 2:
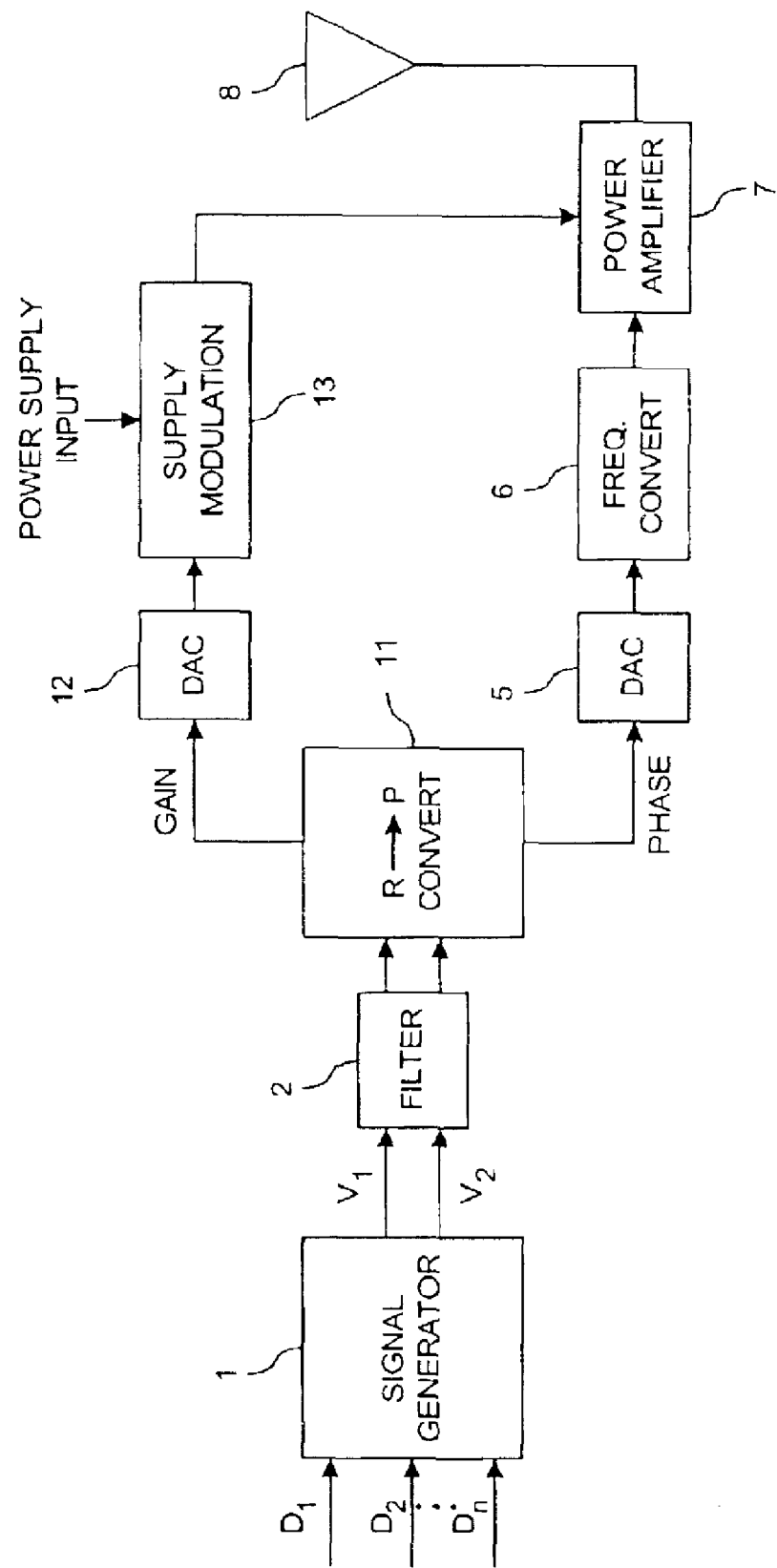
FIG. 2 is a block schematic drawing of a prior art single carrier communication system using envelope elimination and restoration.
Figure 3:
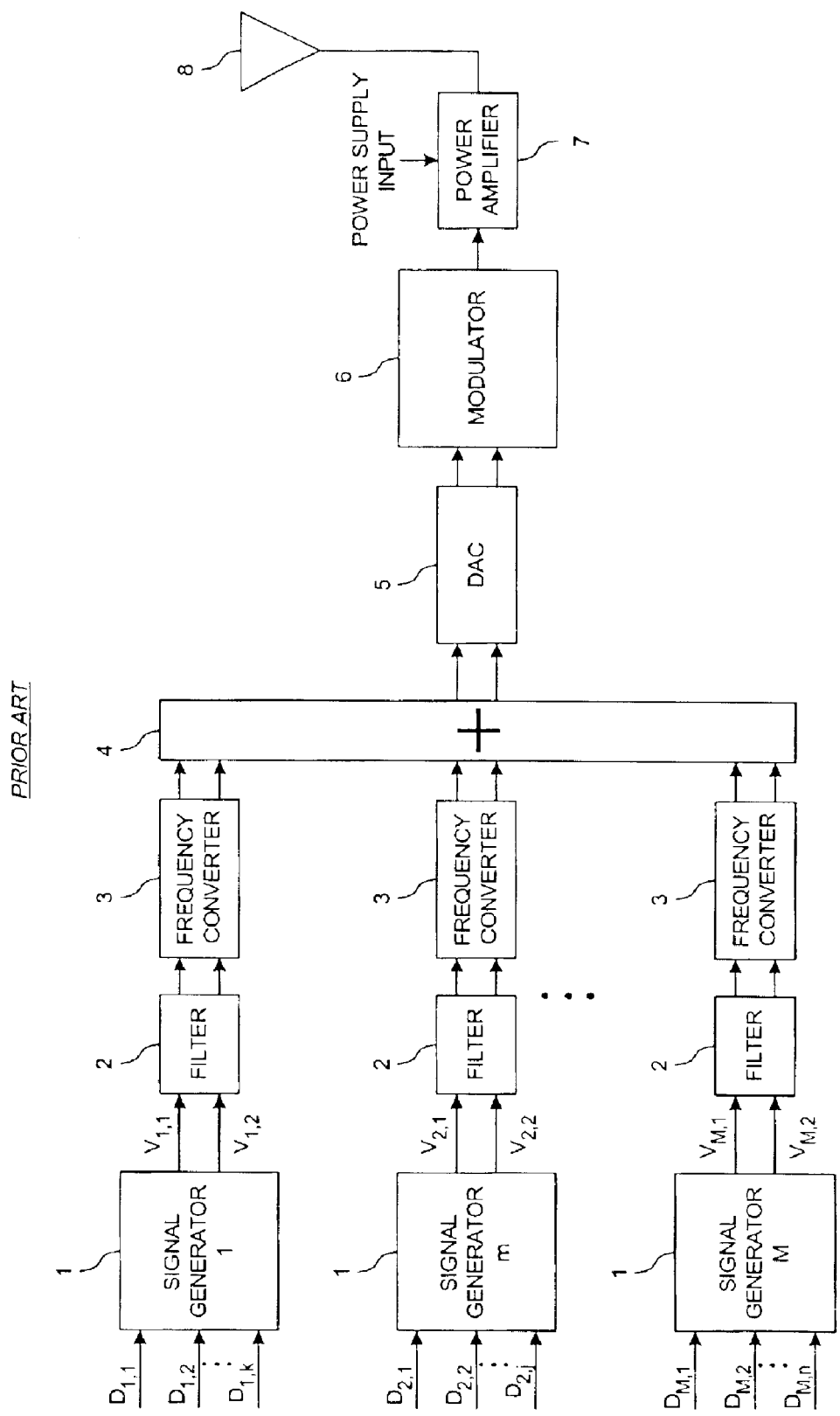
FIG. 3 is a block schematic drawing of a prior art multiple carrier communication system.
Figure 4:
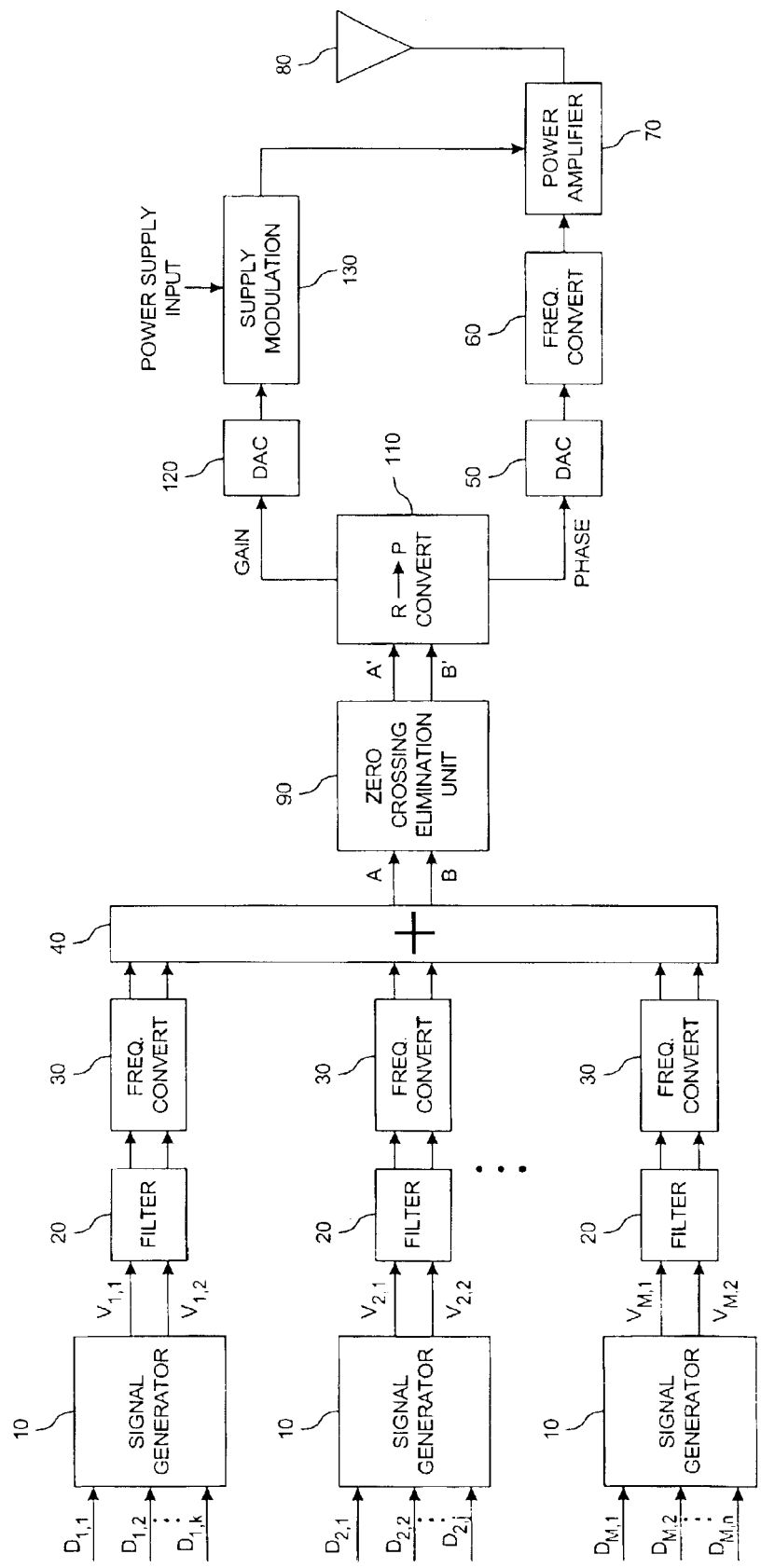
FIG. 4 is a block schematic drawing of a multiple carrier communication system employing signal zero crossing elimination and amplification using envelope elimination and restoration in accordance with one embodiment of the present invention.

Referring to FIG. 4, a preferred embodiment of a communication system employing zero crossing reduction or elimination in accordance with the present invention is illustrated. The specific embodiment illustrated in FIG. 4 is a multi-carrier communication system employing an envelope elimination and restoration amplifier system but the present invention may equally be employed in single carrier communication systems and in communication systems not employing envelope elimination and restoration amplifiers. Specific embodiments of such communication systems are described below in relation to FIGS. 14–16.

As shown in FIG. 4, the output of combiner 40 represents the composite signal stream for the communication system and is composed of an in-phase component stream A and a quadrature-phase component stream B. This digitally sampled signal stream may represent one or more transmit carriers with each of these transmit carriers providing one or more communication channels as produced by the signal generators 10, filters 20, frequency converters 30, and combiner 40. The in-phase and quadrature-phase signal streams are thus a modulated communication signal having user data from multiple channels and the signal amplitude will vary randomly after being combined at combiner 40 irrespective of the modulation scheme. As a result the signal amplitude will approach or cross zero randomly. The modulated communication signal comprising in phase and quadrature-phase signal streams A and B is input to a zero crossing elimination unit 90. The zero crossing elimination unit 90 outputs a modified communication signal comprising a digitally sampled signal stream represented by an in-phase component stream A' and a quadrature-phase component stream B' where signal amplitudes near zero or crossing zero have been reduced or eliminated. Ideally signal amplitudes near zero or crossing zero are eliminated, however, in practice some signal amplitudes near zero or crossing zero may remain in the modified communication signal. Therefore, the zero crossing elimination unit 90 may also be referred to herein as a zero crossing reduction unit. This modified communication signal is then provided to an envelope elimination circuit illustrated in FIG. 4 as rectangular to polar coordinates converter circuit 110. Circuit 110 outputs a phase signal component and a gain signal component. Each time sample of the phase signal component is a unity amplitude phasor at a phase angle determined by the instantaneous phase of the modulated signal output from zero crossing elimination unit 90. The phase component is then digital to analog converted (DAC) 50, RF up conversion modulated by frequency converter 60, and power amplified 70. For example, frequency converter 60 may comprise a mixer receiving and mixing a high frequency carrier signal with the phase component signal as known to those skilled in the art. Alternatively the phase component signal output from the rectangular to polar converter 110 may represent the derivative with respect to time (frequency) of the instantaneous phase of the modulated signal output from the zero crossing elimination unit 90. This alternate signal would then be digital to analog converted (DAC) 50, and converted to a RF signal by application to a voltage controlled oscillator 60, and power amplified 70. The signal envelope is then restored by the gain component provided from the circuit 110. This envelope restoration or gain component is digital to analog converted by digital to analog converter (DAC) 120 and modulated onto the power amplifier power supply by the output of the DAC 120 using power supply modulation circuit 130. The signal output from the power amplifier is then transmitted with an antenna 80.

Figure 5:
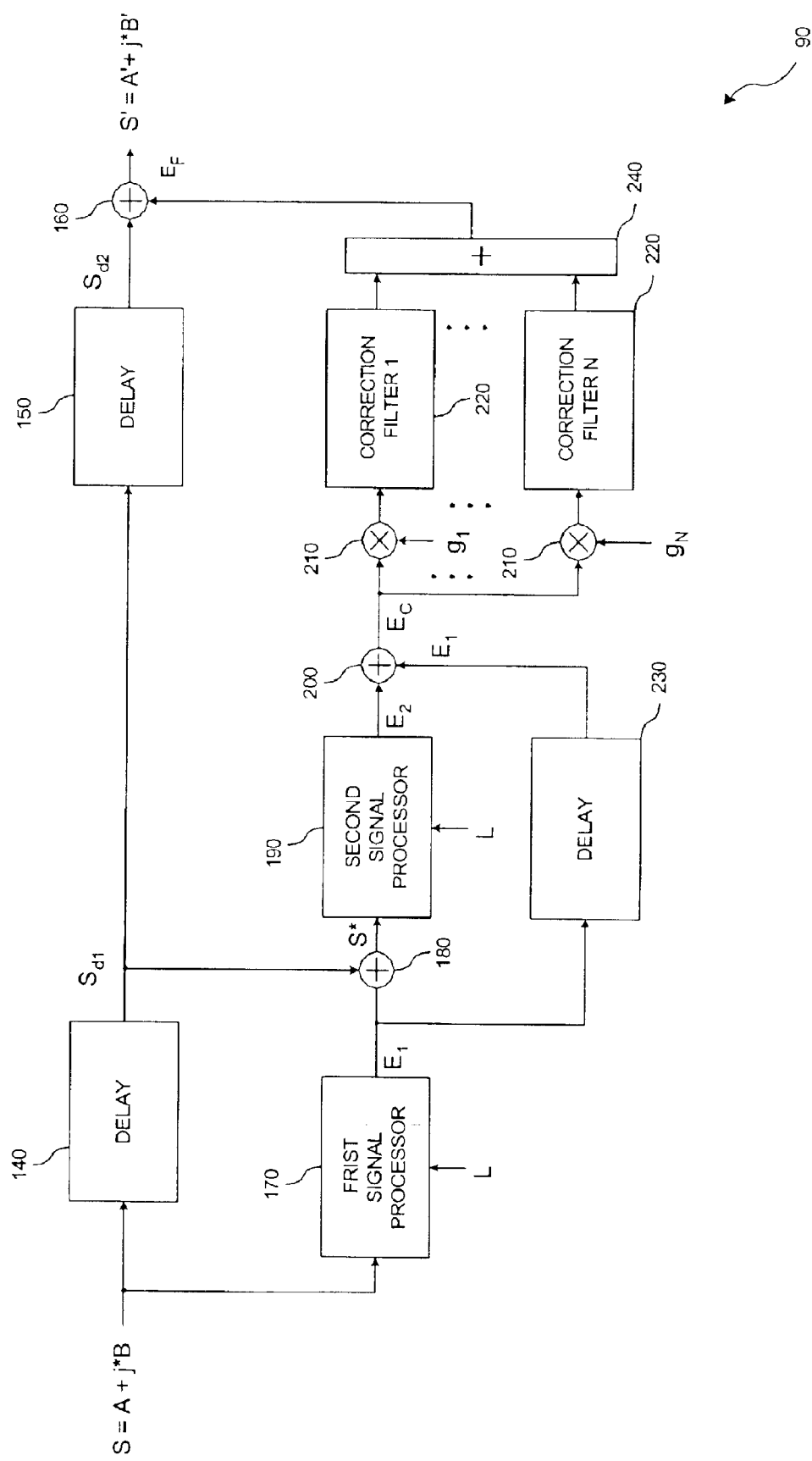
FIG. 5 is a block schematic drawing of a system for reducing or eliminating signal amplitudes which approach or cross zero in a communication system in accordance with the present invention.

Referring to FIG. 5, a detailed embodiment of the zero crossing elimination unit 90 of FIG. 4 is illustrated. The zero crossing elimination unit processes the in-phase and quadrature-phase component streams A and B as a single complex signal stream S. The input signal S is delayed by delay blocks 140 and 150 and combined with a correction signal $E_F$ chosen to eliminate zero magnitude signals and signals approaching zero magnitude. The zero elimination signal $E_F$ is created in a parallel signal processing path. The parallel signal processing path includes two signal processors (170 and 190) and a bank of one or more band limiting filters 220 each of which can be gain adjusted by gain adjustment circuits 210 using separate gain values $g_1$–$g_N$ based on performance requirements, as described in more detail below. The first signal processor 170 calculates a correction signal $E_1$ based on the input signal S and a signal elimination constant L. The second signal processor 190 calculates a correction signal $E_2$ based on signal $E_1$, a delayed version of the input signal S and the signal elimination constant L. Delay circuit 140 provides a delay chosen to match the computation time of the first signal processor 170. The two correction signals $E_1$ and $E_2$ are combined at combiner 200 to create correction signal $E_C$. Signal $E_1$ is delayed by delay circuit 230 to match the computation time of the second signal processor 190. If correction signal $E_C$ were combined with the input signal, after the appropriate delay provided by delay circuit 150, at combiner 160 without passing through the bank of correction filters all signal amplitudes approaching zero within a radius of the signal elimination constant L would be eliminated. The bandwidth of the output signal S' would however exceed the bandwidth requirements of the transmit system. To avoid transmitting excessive bandwidth the bank of correction filters 220 is included.

The bandwidth and frequency dependent gain of the parallel correction filters 220 should be set to meet government allocated spectrum emissions requirements for the transmitting system. Several correction filter options exist. The first option is to simply create one correction filter path and a separate correction filter 220 for each carrier. The frequency dependent gain of each correction filter path would then match the performance of the corresponding filters 20 used in the multiple carrier generation shown in FIG. 4. Since the outputs of each filter shown in FIG. 4 are converted in frequency to a different band, the corresponding correction path filters should be band pass equivalents of those found in FIG. 4. Converting from base band to band pass equivalent filters is apparent to those skilled in the art. By using exact band pass equivalent filters the operator is guaranteed compliance with spectrum allocation and spectrum emission requirements. If desired, however, band pass filters with narrower bandwidth performance could also be used. Narrower band filters may require less computation.

A different correction path filter embodiment may be used in the case where carriers are equally spaced with minimal frequency spacing. In this minimal frequency spaced case one correction filter may be used. The correction filter bandwidth should be set to cover all transmitted carriers. When such a filter is used the bandwidth of the correction signal $E_F$ will span the transmitted carriers but not exceed the bandwidth of the combined carriers. In another case, groups of minimally spaced carriers may exist. Each group of carriers, however, could be separated by more than the minimal spacing. In this case one correction path filter 220 may be provided for each group of minimally spaced carriers. The frequency dependent gain of each correction filter used should then be set to cover the bandwidth of each minimally spaced carrier group.

The government may allocate to an operator more spectrum than needed to meet current communication transmission needs. In such a case, the operator may choose to fill this unused spectrum space with a filtered portion of $E_C$. By transmitting a portion of $E_C$ in this allocated but unused spectrum the burden of zero elimination may be reduced for actual operating carriers. Any of the single or multiple correction filter examples described above can be used to operate with a portion of $E_C$ in the allocated but unused portion of spectrum.

Figure 6:
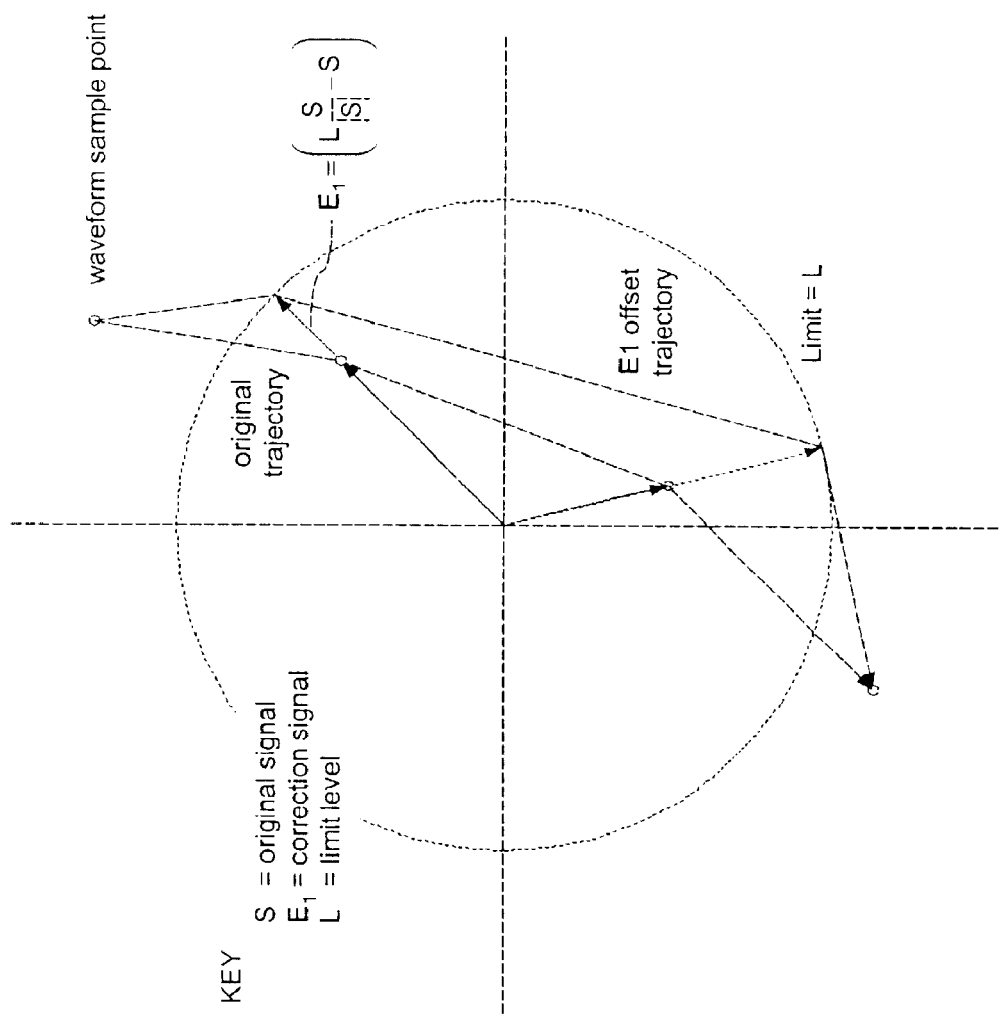
FIG. 6 is a graphical representation of correction of a signal with an amplitude approaching zero amplitude implemented by the first signal processor of FIG. 5.

The signal processor 170 uses Equation (1) to calculate the correction vector $E_1$ for each sample of S. This equation is developed geometrically in FIG. 6. FIG. 6 shows a time trajectory segment of the complex input signal stream S and the calculation of vectors $E_1$ for each sample point which falls within the zero elimination boundary L. The $E_1$ vectors offset the waveform points out to the zero elimination boundary. It should be appreciated, however, that even with the sample point offsets, the lines connecting sample points may still enter the zero elimination boundary. These lines will become signal voltages after conversion to an analog signal. These connecting line boundary violations are corrected by the second signal processor 190.

$$E_1 = \left( L\frac{S}{|S|} - S \right) \tag{1}$$

Figure 7:
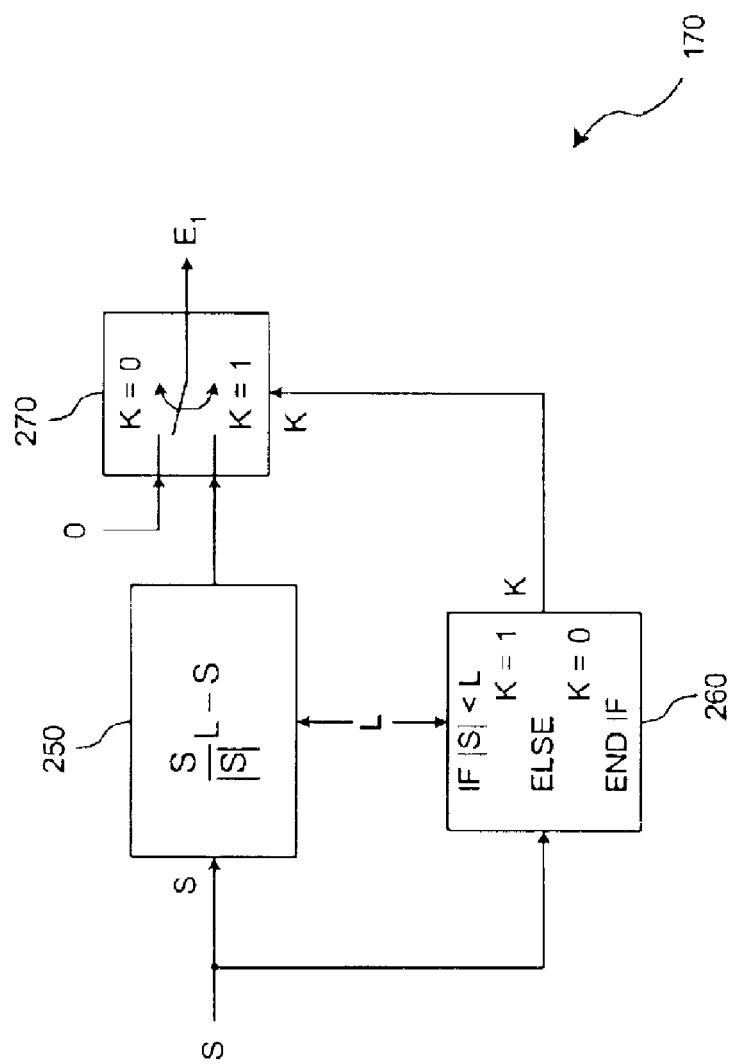
FIG. 7 is a schematic drawing of a processor algorithm for correcting signals by moving waveform sample points from inside a signal elimination boundary to the edge of the signal elimination boundary as graphically shown in FIG. 6.

FIG. 7 shows a block diagram of the first signal processor 170. Equation 1 is performed on input signal S in block 250. The output of block 250 would provide $E_1$ vector offsets that would place all signal points on the zero elimination boundary L. Since vector offsets are only desired for signal points within the zero elimination boundary, the conditional block 260 and switch 270 are provided. Conditional block 260 causes switch 270 to select the $E_1$ vector offset whenever the input signal is within the zero elimination boundary. Otherwise, the switch 270 selects a value of zero for the $E_1$ vector offset. Alternatively, switch 270 could be replaced with a multiplier.

Referring again to FIG. 5 the $E_1$ output of the first signal processor is provided to two parallel signal paths. One path is combined at combiner 180 with a delayed sample of the input signal S provided from delay circuit 140, to produce the input S* to the second signal processor. The other path is delayed by delay circuit 230 and combined with the output of the second signal processor 190. The delay of delay circuit 140 is set to match the computation time of the first signal processor 170. The delay of delay circuit 230 is set to match the computation time of the second signal processor 190.

Figure 8:
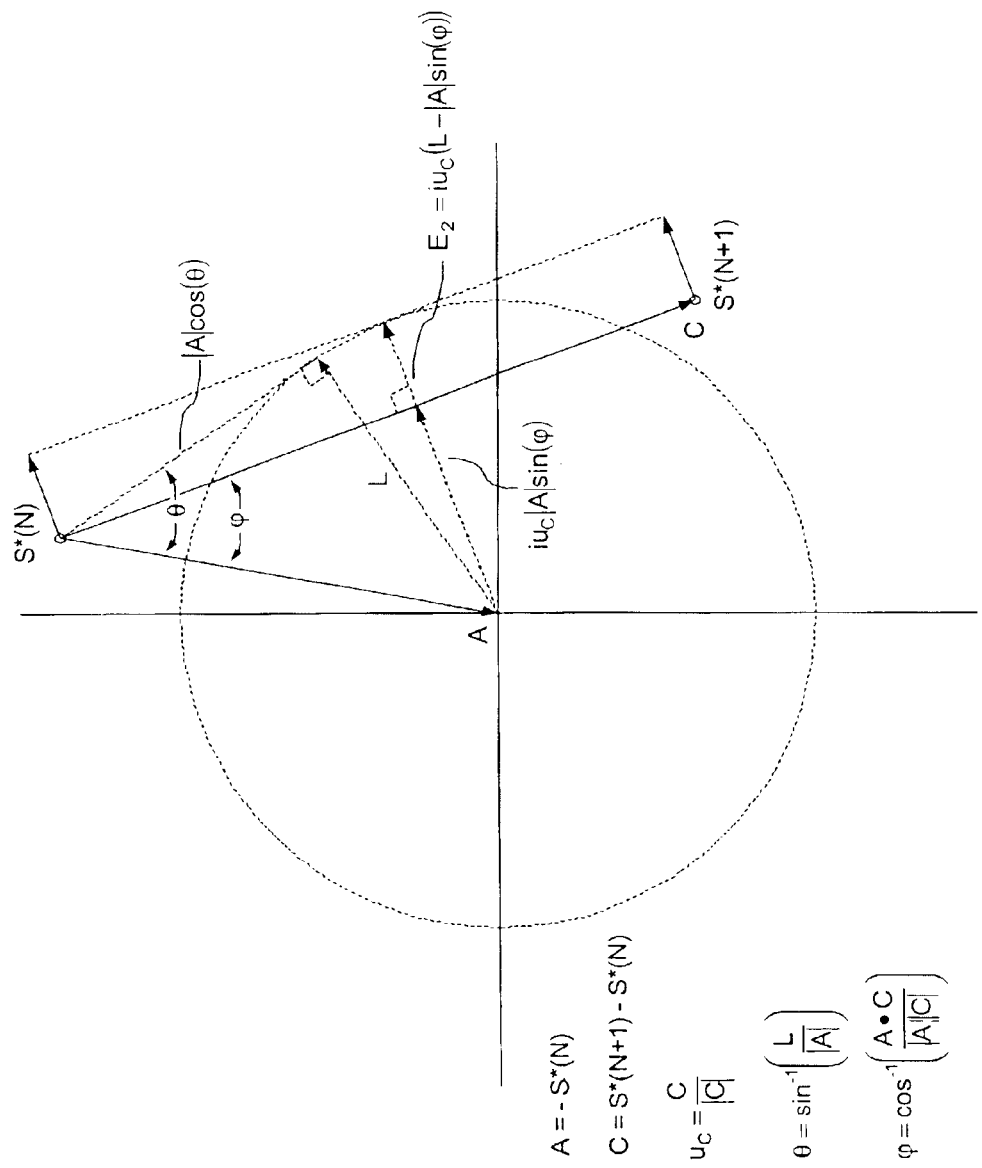
FIG. 8 is a graphical representation of a correction of signal amplitude where the waveform sample points lie outside a signal elimination circle but where a vector connecting those points crosses the signal elimination circle boundary, as implemented by the system of FIG. 5. The graphical approach shown applies when the component of the connecting vector tangent to the signal elimination circle moves in a clockwise direction.
Figure 9:
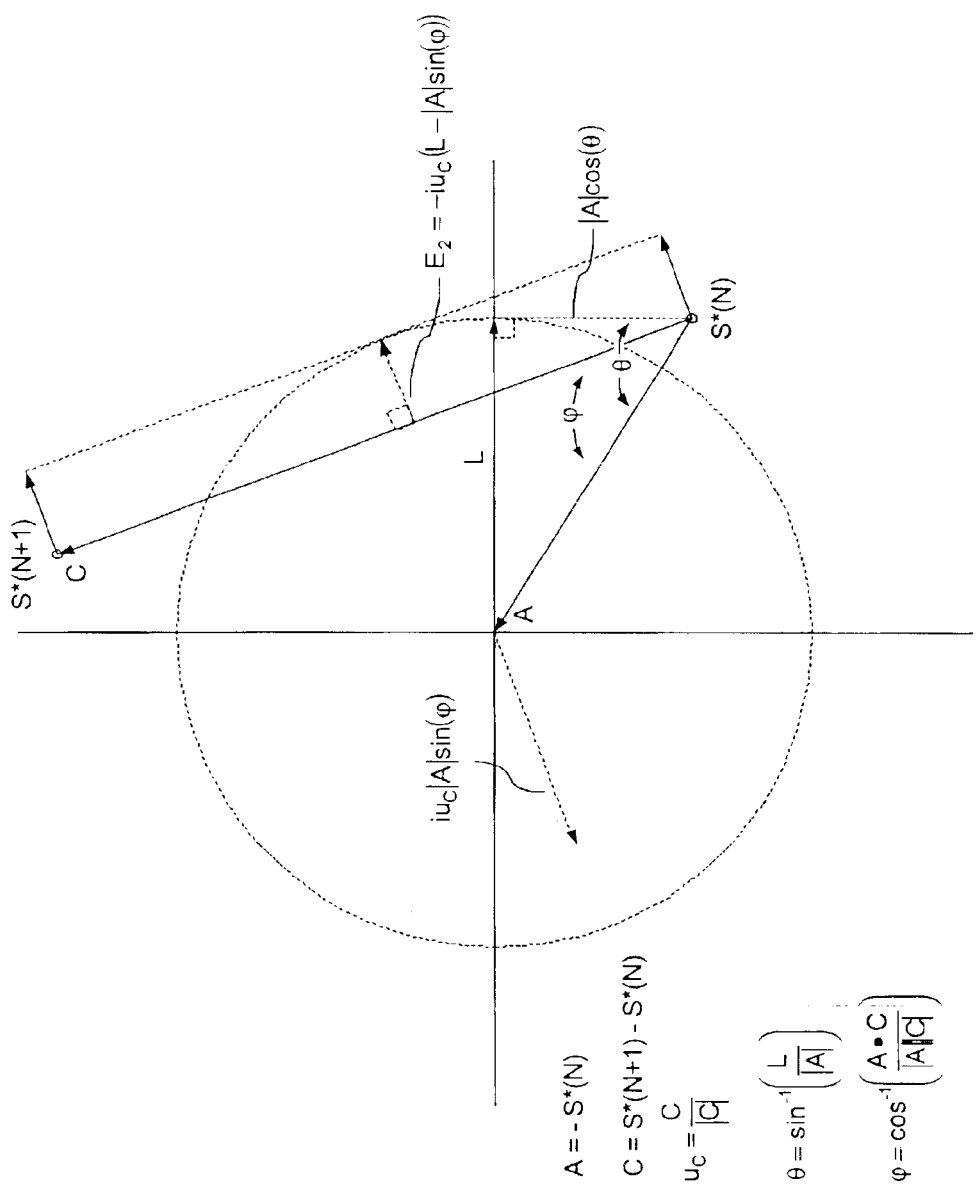
FIG. 9 is a graphical representation of correction of a signal amplitude where the waveform sample points lie outside the signal elimination circle but where a vector connecting those points crosses the signal elimination circle boundary, as implemented by the system of FIG. 5. The graphical approach shown applies when the component of the connecting vector tangent to the signal elimination circle moves in a counter clockwise direction.

The second signal processor 190 calculates offset vectors for pairs of signal points that lie on or just outside the zero elimination boundary but which have connecting line segments which enter the zero elimination boundary. FIG. 8 and FIG. 9 show a graphical development for the calculation of these vectors.

FIG. 8 shows two consecutive sample points of signal S*. These points are connected with vector C. The tail of vector C can be connected to the origin with a vector A. A right triangle can be developed from the origin to the tail of vector C and the radius of the zero elimination boundary L. The angle $\theta$ shown in FIG. 8, for this right triangle, can be calculated using equation (2).

$$\theta = \sin^{-1}\left(\frac{L}{|A|}\right) \tag{2}$$

The angle $\phi$ between the vectors A and C can be calculated using equation (3) below. The numerator of equation (3) represents the vector dot product of vector A and vector C.

$$\varphi = \cos^{-1}\left(\frac{A \cdot C}{|A||C|}\right) \tag{3}$$

For a line segment connecting both points of S* to violate the zero elimination boundary, two inequalities must be satisfied. These inequalities are given in equations (4) and (5).

$$\phi < \theta \tag{4}$$

$$|A|\cos(\theta) < |C| \tag{5}$$

For FIG. 8 the offsetting vectors applied to both sample points of S* can then be calculated from equation (6).

$$E_2 = iu_C(L - |A|\sin(\phi)) \tag{6}$$

The term $iu_C$ given in equation (6) is the imaginary operator 'i' multiplied times a unit vector pointing in the direction of vector C. The equation for unit vector $u_C$ is given in equation (7).

$$u_C = \frac{C}{|C|} \tag{7}$$

FIG. 9 shows a similar development for the quantities given in equations 2 through 5 but with the direction of vector C reversed. For FIG. 9 the offsetting vectors applied to both sample points of S* would be calculated from equation (8).

$$E_2 = -iu_C(L - |A|\sin(\phi)) \tag{8}$$

Both FIG. 8 and FIG. 9 show vector C connecting to consecutive points of signal S*. The direction of vector C will follow the random variation of signal S*. Equation (6) will apply when the projection of vector C onto the zero elimination boundary circle points in a clockwise direction. Equation (8) will apply when the projection of vector C onto the zero elimination boundary circle points in a counter clockwise direction. A simpler method for determining when to multiply equation (6) by negative one to acquire equation (8) is to determine if the following inequality is true.

$$||A|\sin(\phi)iu_C + A| > ||A|\sin(\phi)iu_C - A| \tag{9}$$

Whenever equation (9) is satisfied, $E_2$ would be calculated using equation (8) otherwise equation (6) would be used.

Figure 10:
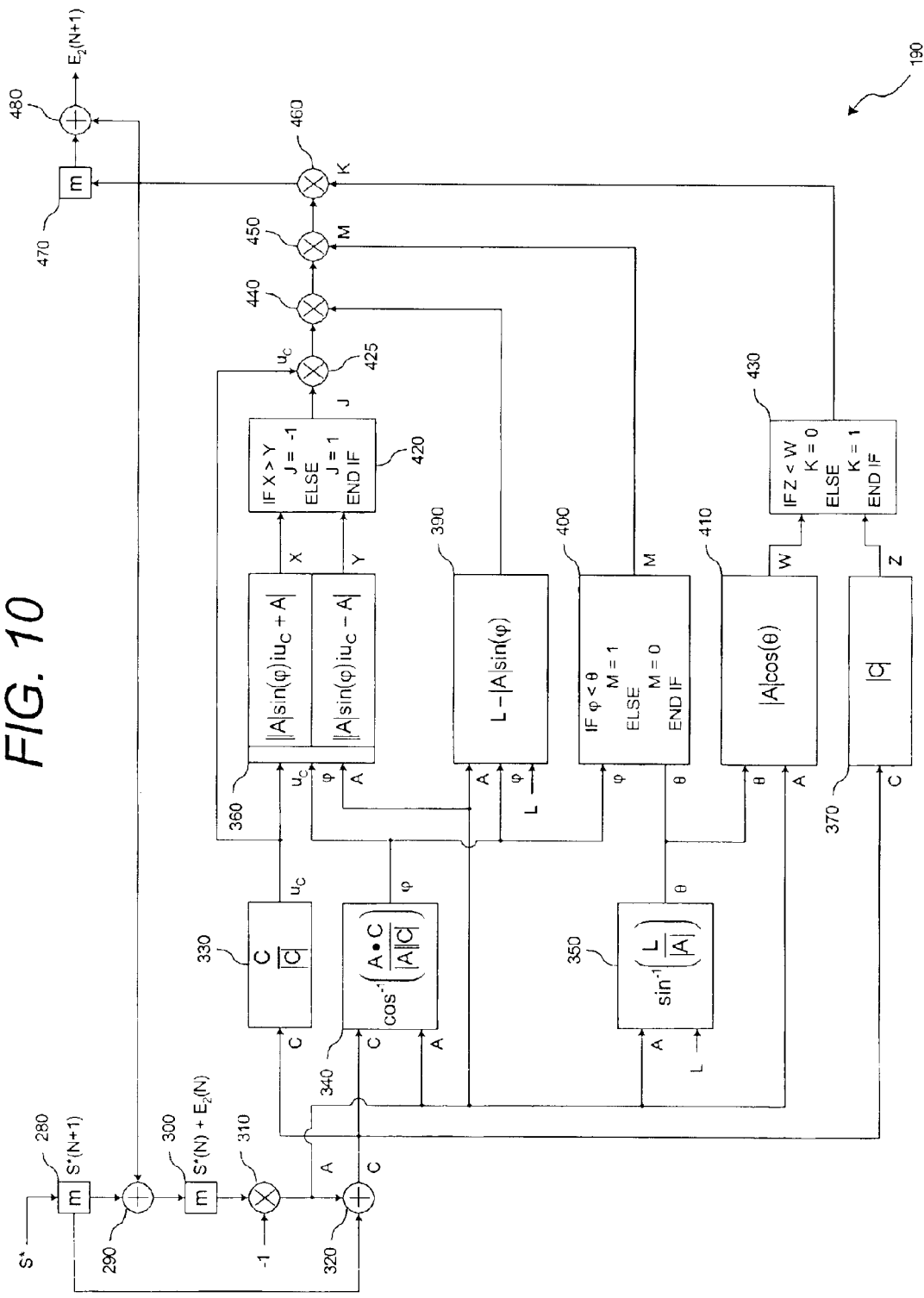
FIG. 10 is a block schematic drawing of a processor algorithm for correcting signals by moving waveform sample points which are outside a signal elimination boundary but which have a connecting vector which crosses the signal elimination boundary so that the connecting vector lies outside the signal elimination boundary as shown graphically in FIG. 8 and FIG. 9.

FIG. 10 shows a block diagram realization of the signal processing performed in block 190 of FIG. 5. The input memory shift register 280 holds the current point in the signal S*. The memory shift register 300 holds the previous point of signal S* plus the previous offset correction calculated for the previous pair of data points stored in memory registers 280 and 300. The output of memory register 300 is multiplied at 310 by minus one to create vector A shown in FIG. 8 and FIG. 9. The output of multiplier 310 is also added by adder 320 to the output of memory shift register 280 to produce vector C shown in FIG. 8 and FIG. 9. From these two vectors and the zero elimination boundary radius constant L, the current correction constant $E_2$ can be calculated. Block 300 calculates the unit vector in the direction of vector C as given in equation (7). Block 340 calculates the angle $\phi$ as given in equation (3). Block 350 calculates the angle $\theta$ as given in equation (2). Blocks 360 and 420 apply the inequality given in equation (9) that changes the direction of $iu_C$ at multiplier 425. The magnitude of the offset needed for the data points currently in memory registers 280 and 300 is calculated in block 390. Block 400 and multiplier 440 determine and apply the inequality given in equation (4). Block 410, 370, 430 and multiplier 460 determine and apply the inequality given in equation (5). The output of multiplier 460 is the vector offset needed for the data points currently in memory registers 280 and 300. The offset is added at 480 to the offset calculated for the previous pair of data points which is stored in memory register 470. The output of FIG. 10 is combined with a delayed version of the input signal S at combiner 160 in FIG. 5. The delay of delay circuit 140 is set to match the delay of the second signal processor 190 and the delay of the correction filter bank composed of components 210, 220, and 240.

Prior to passing through the correction filters each correction filter path is gain adjusted by a constant gain value $g_n$ as shown in FIG. 5. These constants serve two purposes. First, the constants are used to prevent excessive signal offsetting. This excessive offsetting is created when the correction signal $E_C$ is band limited by the parallel correction filters 220. An example will be given below to illustrate this excessive suppression. Second, the gain values are used to distribute the burden of zero elimination to each allocated transmit band. This distribution is generally based on the average power allocated to each carrier or transmit band of the signal S input to FIG. 5. If for example each carrier in the transmit band of S were allocated the same transmit power, and each carrier had a corresponding correction filter, each gain constant $g_n$ would be the same value intended only to prevent over excessive zero offsetting in S. In such an example case a single application of gain could be provided prior to creating the parallel correction filter paths. In another example the input signal S may be composed of three carriers with average relative power levels of 1, 1, and 0.25 respectively. If each carrier had a corresponding correction path the gain constants may be set to $g_1=g^*(1/2.5)$, $g_2=g^*(1/2.5)$ and $g_3=g^*(0.5/2.5)$ respectively (sqrt(1)+sqrt(1)+sqrt(0.25)=2.5). The remaining constant g would then be set to prevent excessive zero offsetting in S. In a final example, the operator may choose to place a greater burden of zero offsetting on some correction filter bandwidths over others. These bandwidths may be allocated for use but not currently occupied by transmit carriers. By placing a greater (or the entire) burden on these allocated by unused portions of spectrum improved communications will exist in the used portions of spectrum. An operator may also choose to place a greater burden on carriers that can tolerate higher communication errors. For example carriers that carry data communication are less tolerant of errors than carriers that carry voice communication. By adjusting the gain constants $g_n$, overall communication performance can be optimized while applying zero offset corrections.

Figure 11:
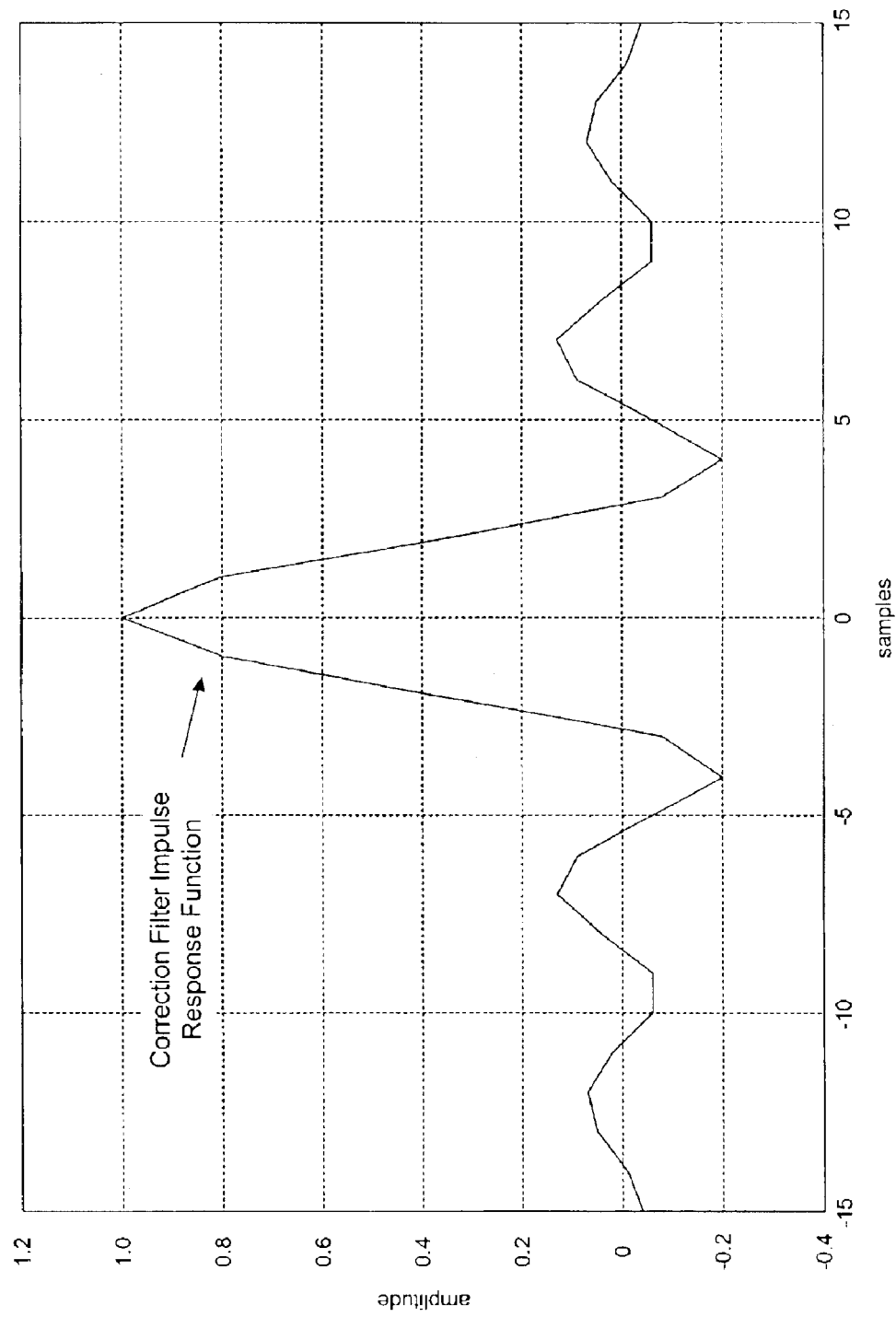
FIG. 11 is a graphical representation of an example correction filter impulse response for limiting the bandwidth of the correction signal used to eliminate signal amplitudes which approach near or cross zero, employed in the system of FIG. 5.

To illustrate an example of excessive zero offsetting caused by band limiting the correction signal $E_C$, consider the case where zero crossings are to be eliminated from a signal composed of several minimally spaced carriers and only one correction filter is used. Each sample of $E_C$ input to the correction filter would produce an output reproduction of the correction filter impulse response function that is gain adjusted by the input $E_C$ sample. These reproductions are combined to produce the correction filter output. FIG. 11 shows a typical impulse response function that may be implemented by a correction filter 220. This impulse response function is shown for example purposes only. The impulse response function used in the one or more correction filter paths of an actual functioning system will be determined by system needs. It is instructive to examine the correction filter output based on a few simple example $E_C$ signal streams.

Consider a short duration zero crossing in signal stream S that produces a correction signal $E_C$ composed of two equal amplitude correction samples in time sequence. These two correction samples would be preceded and followed by zero valued samples based on the output combiner 200 of FIG. 5. The correction filter input and output signals $E_C$ and $E_F$ for this example are both shown in FIG. 12. The two non-zero input samples of $E_C$ are just over 0.6 in amplitude. The figure shows how the impulse response function of the correction filter acts on $E_C$ to create $E_F$. The filtered correction signal amplitude F corresponds to the input signal correction amplitude C in FIG. 6. To prevent excessive offsetting, a gain adjustment g must be applied in the correction signal generation path prior to combining with signal S in FIG. 5. For the example shown in FIG. 12 this gain g was calculated by simply taking the ratio of C over F.

Figure 12:
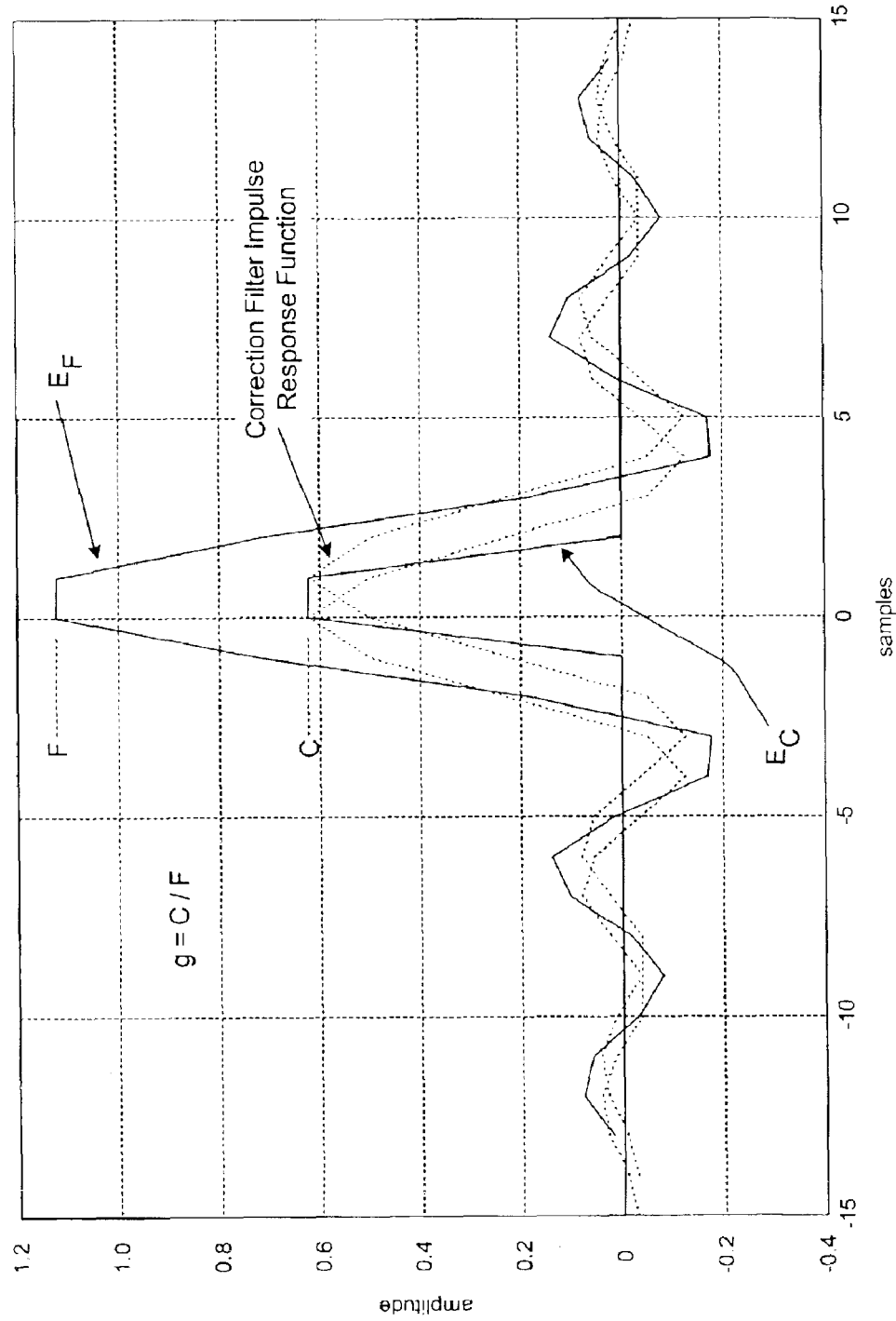
FIG. 12 is a graphical application of the correction filter impulse response of FIG. 11 to correction signal sample points in time and illustrates calculation of the gain of the filtered correction signal before addition with the communication signal.

The gain calculation in the example of FIG. 12 was specific to the example $E_C$ sample stream described. If the correction filter input signal stream were just one correction sample preceded and followed by zero valued samples, the filter input and output amplitudes would have been the same at the required correction instant. In this second example, the gain g calculated would have been one.

The two examples used to evaluate the gain constant g provided different gains for different correction signal input examples. Any real correction signal $E_C$ will produce an infinite number of similar type examples. The gain constant g used should preferably provide the best possible signal offset for all possible variations in $E_C$. Typical variations in $E_C$ can be determined by performing a trial using a representative fixed time length complex input signal S, and a zero elimination constant L. With a typical $E_C$ signal produced, a series of test trials can be performed with different gain g constants. From these trials curves of S' power remaining in the zero elimination circle versus gain g and $E_F$ signal power versus gain g can be plotted to determine the best performance producing gain g value.

Figure 13:
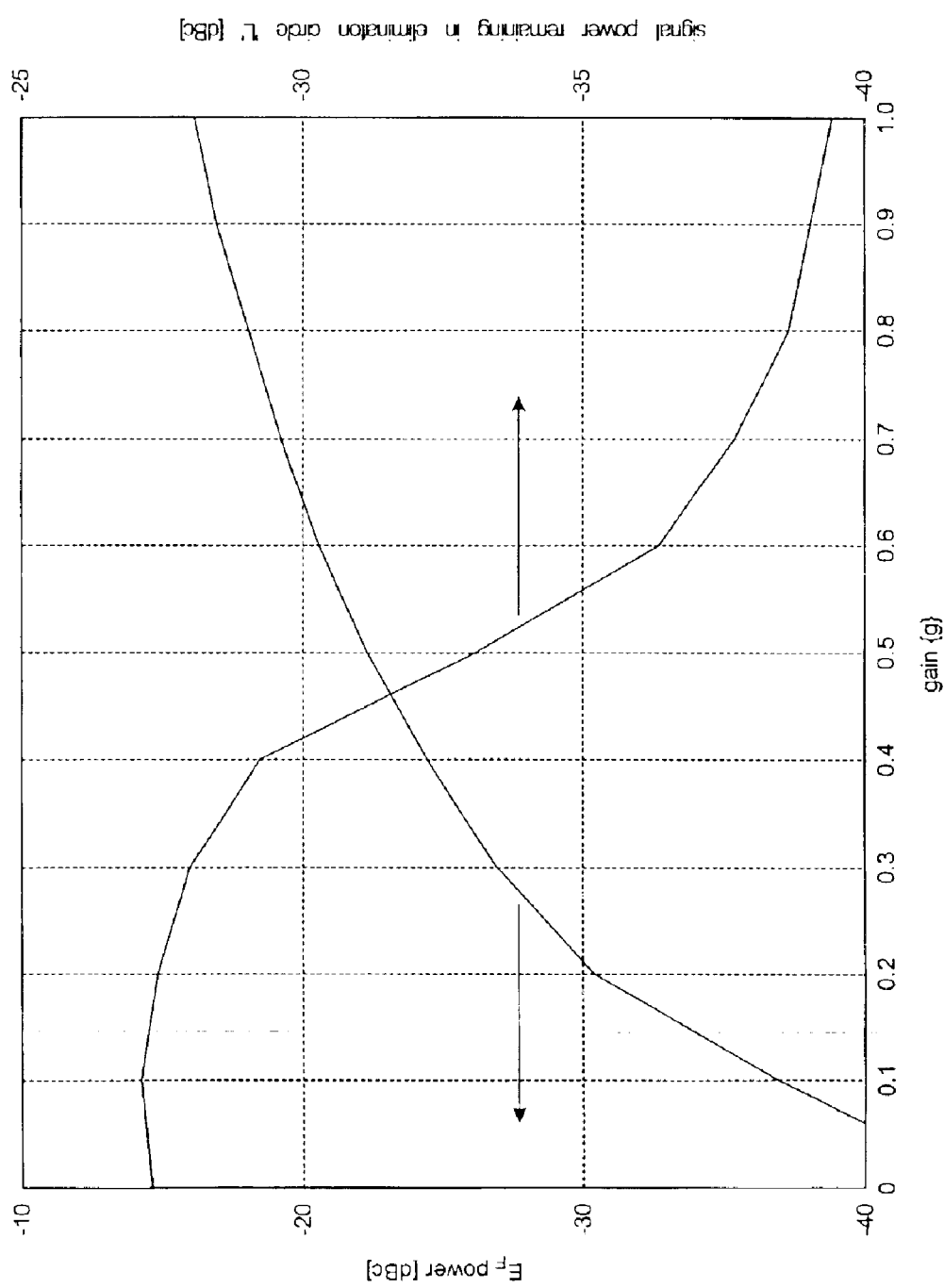
FIG. 13 is a graph illustrating the effect of increasing correction signal gain on the reduction of signal power in the signal elimination circle boundary and the effect of increasing correction signal gain on the interference caused by the gain adjusted correction signal.

FIG. 13 shows an example set of these curves for a specific test case. The exact particulars of the test case are not important. The curves are shown as an example on how to select the best performing gain g constant. One curve in FIG. 13 shows the power of $E_F$ measured relative to the power in S just prior to combining with S. The other curve shows the power remaining within the zero elimination boundary of the output signal S' relative to the power found in S. $E_F$ signal power represents distortion to the desired output signal S. $E_F$ signal power should be kept to a minimum to avoid degrading overall system communication quality. FIG. 13 shows that lower gains produce lower $E_F$ signal power but also increase the amount of power found within the zero elimination boundary. The curve showing the power remaining in the zero elimination boundary has a power reduction knee at gain g equal to 0.4. For this example the gain g should be set greater than 0.4. Increasing gain g much beyond 0.6 shows marginal improvement for increasing amounts of distortion caused by $E_F$. For this example gain g should be less than 0.6 to avoid excessive distortion.

The gain g selection demonstrated above was shown for demonstration purposes only. In an actual system several gain constants would need to be determined. These gain constants would be determined in a two step process. First a method of distribution would be determined. Several examples were given based on carrier power distribution and carrier communication error requirements. One example given above was for distribution based on power weighting. This method provides the same signal-to-noise effects on each carrier. Other beneficial distribution methods may exist based on the specific application. With the method of distribution set a common gain constant g would then be set using the method described above for the single correction path example.

Further zero elimination can be achieved by cascading in series multiple zero crossing elimination units 90 shown in FIG. 4. By cascading zero elimination units, lower gain values can be use in the initial stage providing less signal distortion than if a larger gain value were selected in a single stage process. The method shown in FIG. 13 should be used to determine the gain g constants for each stage. Since the input to each successive stage is already partially zero eliminated, the gain g constants should be optimized to a different value for each stage. When performing test trials on successive stages the input signal used should be the zero eliminated signal from the preceding stage where the gain g has been previously optimized. If the zero elimination boundary constant L is the same for each successive stage, the output signal minimum signal will closely approach the limiting constant L within two or three successive stages.

Figure 14:
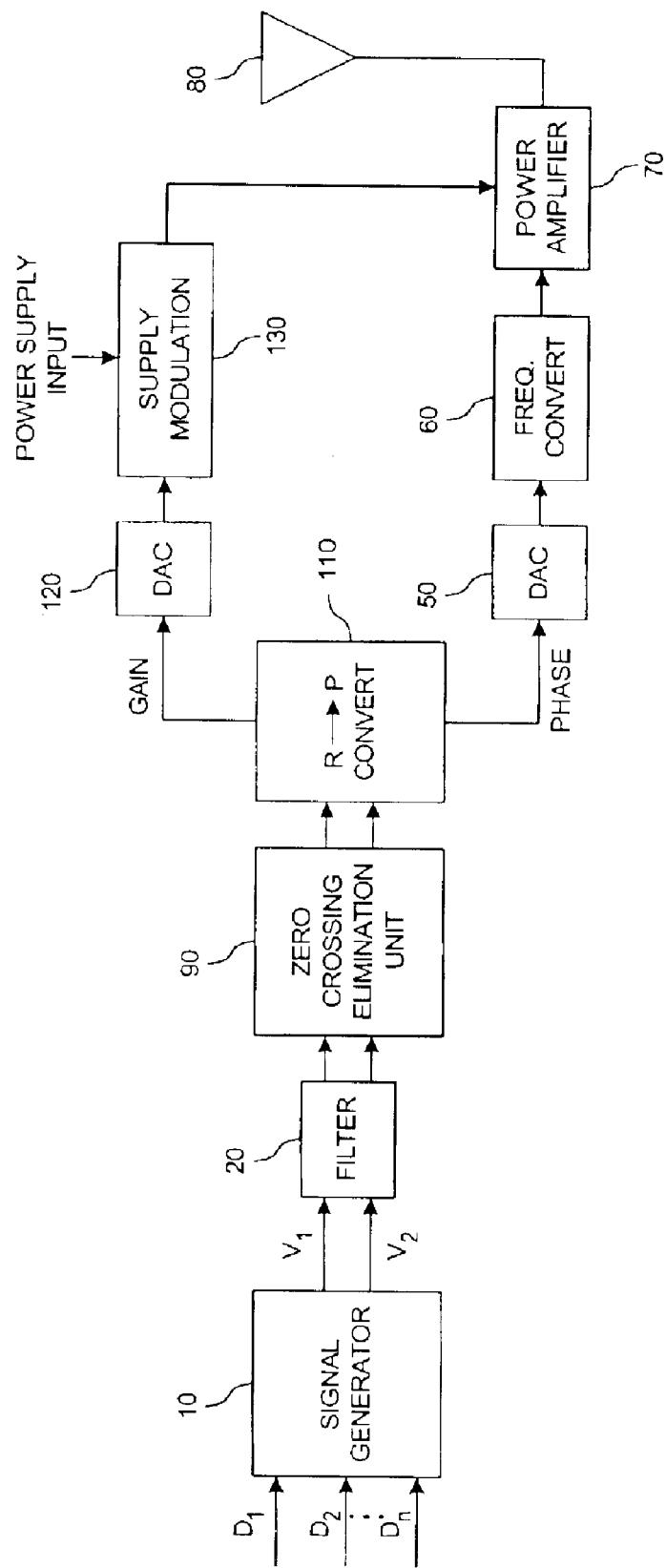
FIG. 14 is a block schematic drawing of a single carrier communication system employing signal zero crossing reduction and amplification using envelope elimination and restoration in accordance with another embodiment of the present invention.
Figure 15:
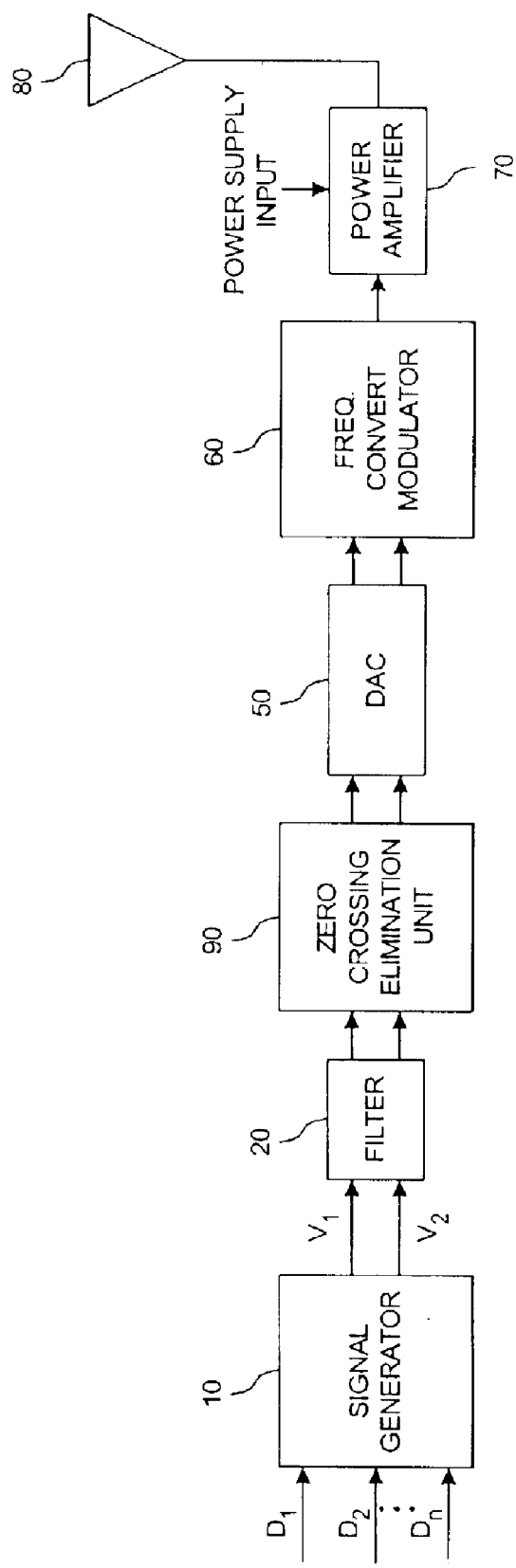
FIG. 15 is a block schematic drawing of a single carrier communication system employing signal zero crossing reduction in accordance with another embodiment of the present invention.
Figure 16:
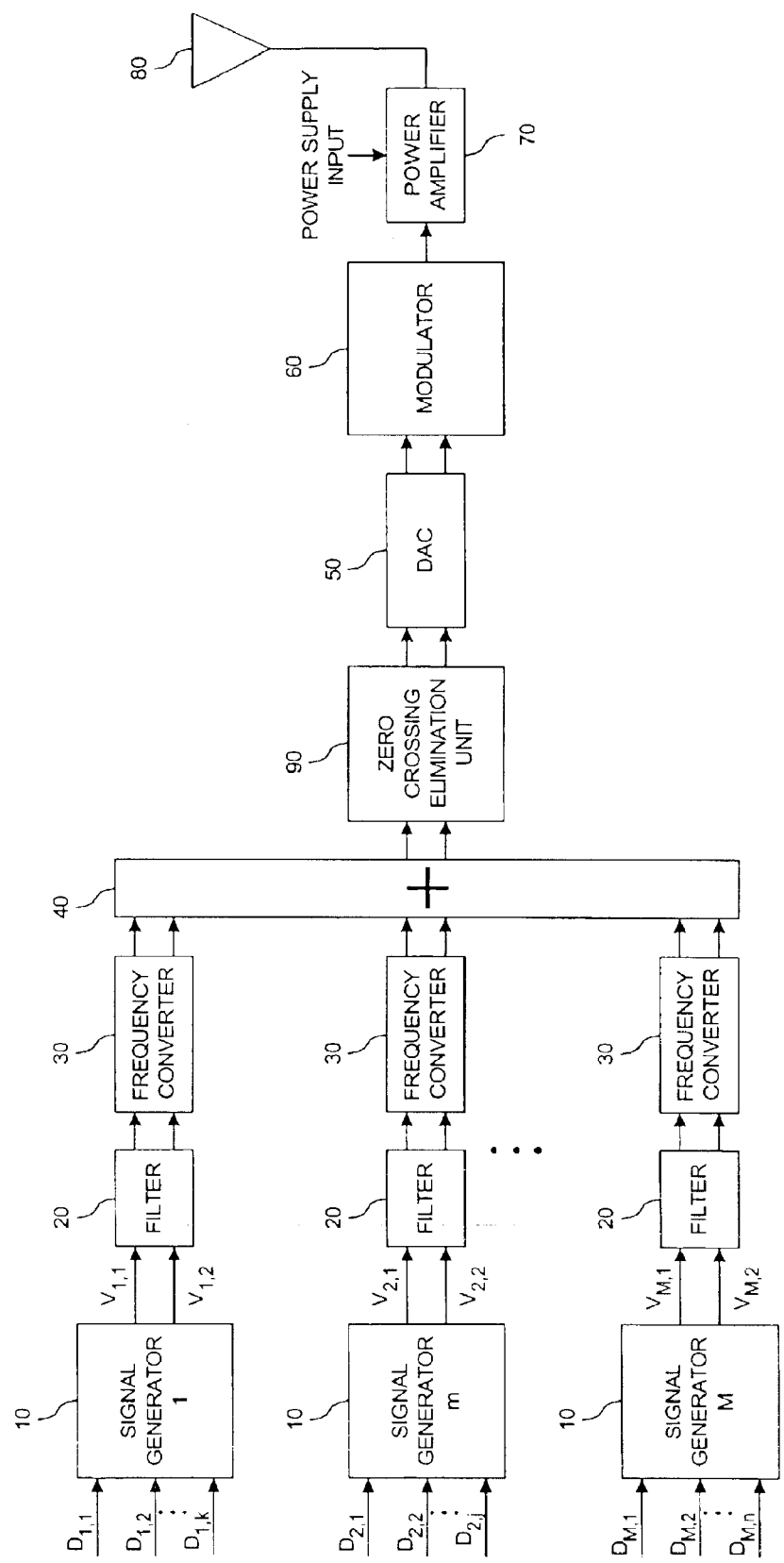
FIG. 16 is a block schematic drawing of a multiple carrier communication system employing signal zero crossing reduction in accordance with another embodiment of the present invention.

The above discussion detailed the implementation of the present invention in a multi-carrier communication system employing an envelope elimination and restoration amplifier, system as shown in FIG. 4. The present invention can also be implemented in a single carrier communication system embodiment employing an envelope elimination and restoration amplifier system as shown in FIG. 14. The present invention can also be implemented in single and multiple carrier communication system embodiments which do not employ envelope elimination and restoration amplifiers and thus do not create separate gain and phase signal paths prior to conversion from digital to analog signals. FIG. 15 illustrates an implementation of the present invention in such a single carrier communication system embodiment and FIG. 16 illustrates such a multi-carrier communication system embodiment. Like numeral 90 for the zero crossing elimination unit in these figures indicates that the zero crossing elimination unit may be implemented as previously described, however, the other communication system components illustrated may be implemented in a variety of ways known to those skilled in the art. Accordingly, the power amplifiers 70, may or may not include internal circuits to adjust the supply voltage in sympathy with the input signal amplitude. The present invention may still provide performance benefits to such systems since many amplifier types provide non-linear gain at low signal amplitudes. Also many amplifier types can be tuned for higher operating efficiency if the input signal amplitude does not approach or cross zero.

Additional variations of the above described embodiments of the invention may also be implemented. In particular, the above described embodiments show the zero crossing elimination unit 90 configured after the filter 20, however, it may also be configured before filter 20. In such an implementation the need to keep the modified communication signal (with zero crossings eliminated) within the allowed spectral band (or bands) will be enforced by the filter 20 and the correction filters 220 in zero crossing elimination unit 90 are not needed. The effect of filter 20 may create new zero crossings, however, or may make correction unnecessary for some signals (i.e., the effect of filter 20 will be to remove a zero crossing of the original input signal making an adjustment unnecessary). Therefore, in such an embodiment the zero crossing elimination unit 90 will preferably employ a filter predictor for predicting the signal values after filtering. The zero crossing elimination algorithm described above will then be employed on the predicted signal values and correction values based on this processing combined with the (delayed) input communication signal. Implementation of a suitable filter predictor is described in detail in U.S. Pat. No. 6,449,302 to Matthew Hunton, the disclosure of which is incorporated herein by reference in its entirety. In a multi-carrier implementation separate filter predictors may be employed for each carrier to predict the effect of the separate plural filters 20 shown in FIGS. 4 and 16 as described above and the combined predicted values used to compute zero elimination correction values. Implementation of plural filter predictors in parallel to predict the effect of filtering and combining a multi-carrier signal is disclosed in detail in U.S. Pat. No. 6,449,303 to Matthew Hunton, the disclosure of which is incorporated herein by reference in its entirety. Therefore, the implementation of such a modified zero crossing elimination unit 90 and modified communication system will be apparent to those skilled in the art based on these disclosures and such implementations are equally incorporated herein. Also, it may be advantageous to combine the use of such filter predictors and/or algorithm processors for zero crossing elimination and peak reduction as disclosed in the above noted patents and such a combined system providing both zero crossing elimination and peak reduction is also incorporated herein by reference to those patents. Furthermore, a combined implementation of zero crossing elimination unit 90 and a post filter peak reduction unit such as described in U.S. patent application Ser. No. 10/102,493 filed Mar. 20, 2002 or in U.S. patent application Ser. No. 10/127,164 filed Apr. 22, 2002, both to Matthew Hunton, may also be advantageous and such a combined system is also incorporated herein by reference to those patent applications.

The present invention thus provides a system and method for eliminating signal zero crossings in communication systems transmitting modulated signals which approach or cross zero in a random manner due to combination of plural user channels. By doing so, a number of advantages are provided. For example, a reduction in bandwidth of the signal to be amplified and transmitted may be provided. This reduces the performance requirements placed on the amplifier and various other system components allowing a reduction in system costs for a given performance level. Also, the present invention allows the technique of envelope elimination and restoration to be employed in multi-channel communication systems, such as spread spectrum and multiple carrier communications systems, and thus provides the efficiency advantages related to such approach. Further features and advantages of the present invention will be appreciated by those skilled in the art.

A number of different embodiments of the present invention have been described in relation to the various figures. Nonetheless, it will be appreciated by those skilled in the art that a variety of additional embodiments are possible within the teachings of the present invention. For example, a variety of specific circuit implementations and a variety of specific processor implementations may be provided employing the teachings of the present invention and limitations of space prevent an exhaustive list of all the possible circuit implementations or an enumeration of all possible processor algorithms. A variety of other possible modifications and additional embodiments are also clearly possible and fall within the scope of the present invention. Accordingly, the described specific embodiments and implementations should not be viewed as in any sense limiting in nature and are merely illustrative of the present invention.

What is claimed is:

1. A zero crossing reduction unit adapted for use in a communication system, the zero crossing reduction unit comprising:
   a first signal path receiving a modulated input signal having signal amplitudes and trajectories varying so as to cross below a predetermined amplitude in a random manner, the first signal path including a delay circuit for delaying the input signal;
   a second parallel signal path receiving said input signal and including a correction calculation unit for calculating a correction for signal amplitudes and trajectories crossing below a predetermined amplitude; and
   a combiner combining the correction and delayed input signal and providing an adjusted output signal in which signal amplitudes and trajectories which cross below a predetermined amplitude are reduced or eliminated.

2. A zero crossing reduction unit as set out in claim 1, wherein said correction calculation unit comprises a signal amplitude adjuster that calculates additive signal corrections to move signal amplitudes less than a predetermined limit value to said limit value and a signal trajectory adjuster that calculates additional additive signal corrections to adjust signal amplitudes such that signal trajectories do not pass through said limit value.

3. A zero crossing reduction unit as set out in claim 2, wherein said signal amplitude adjuster further comprises a signal magnitude detector, a comparator for comparing the signal magnitude to a predetermined limit value and a switch coupled to the output of the comparator and the correction calculation unit for providing the correction to the combiner if the signal magnitude is less than the predetermined limit value.

4. A zero crossing reduction unit as set out in claim 2, wherein said signal trajectory adjuster first identifies signal pairs connected with trajectories which pass below a predetermined limit value and then calculates additive corrections to said signal pairs such that the signal trajectories no longer pass below said limit value.

5. A zero crossing reduction unit as set out in claim 2, wherein the input signal comprises digital samples represented by complex vectors and wherein the signal amplitude adjuster comprises a first processor which performs a complex vector calculation on the input samples to determine a complex correction vector which when added to the input sample results in a signal amplitude at or outside the predetermined limit value and wherein the signal trajectory adjuster comprises a second processor which performs a complex vector calculation on the input samples to determine a complex correction vector which when added to the input sample results in a signal trajectory which does not pass through the predetermined limit value.

6. A zero crossing reduction unit as set out in claim 1, wherein said second signal path further comprises a correction filter coupled before the combiner and providing a filtering operation on the correction prior to combining with said delayed input signal.

7. A zero crossing reduction unit as set out in claim 6, wherein said input signal is band limited and wherein said filter provides a filtering operation limiting the correction signal to a frequency band equivalent to the spectral band of the band limited input signal.

8. A zero crossing reduction unit as set out in claim 1, wherein said second signal path further comprises a plurality of correction filters in parallel coupled before the combiner and providing a plurality of different filtering operations on the correction prior to combining with said delayed input signal.

9. A zero crossing reduction unit as set out in claim 8, wherein said input signal is a multiple carrier signal limited to plural frequency bands and wherein each of said plurality of correction filters provides a filtering operation limiting the correction signal to a frequency band equivalent to the spectral band of one carrier.

10. A zero crossing reduction unit as set out in claim 8, wherein said second signal path further comprises a plurality of gain circuits coupled to respective correction filter paths for adjusting the amplitude of the correction by a plurality of different gain values.

11. A zero crossing reduction unit as set out in claim 1, wherein said second signal path further comprises a gain circuit for adjusting the amplitude of the correction by a gain value.

12. A method for adjusting signal amplitudes and trajectories below a predetermined limit value, comprising:
   receiving a modulated input communication signal having signal amplitudes and trajectories which vary below a predetermined limit value;
   determining the amplitude of the input communication signal;
   adjusting input signals having an amplitude less than a predetermined value and providing an amplitude adjusted signal having signal amplitudes less than said predetermined value reduced or eliminated, wherein adjusting the input signals comprises combining a correction signal with the input signal and filtering the correction signal prior to combining the correction signal with said input signal;
   determining the trajectory of said amplitude adjusted signal; and
   adjusting said amplitude adjusted signals having trajectories less than a predetermined value such that signal trajectories less than said predetermined value are reduced or eliminated.

13. A method for adjusting signal amplitudes and trajectories below a predetermined limit value as set out in claim 12, wherein the modulated input communication signal comprises a multi-channel signal comprising a plurality of separate user channels combined together.

14. A method for adjusting signal amplitudes and trajectories below a predetermined limit value as set out in claim 13, wherein the modulated input communication signal comprises a multiple carrier communication signal.

15. A method for adjusting signal amplitudes and trajectories below a predetermined limit value as set out in claim 13, wherein the modulated input communication signal comprises a spread spectrum communication signal.

16. A method for adjusting signal amplitudes and trajectories below a predetermined limit value as set out in claim 13, wherein the modulated input communication signal comprises a CDMA signal.

17. A method for adjusting signal amplitudes and trajectories below a predetermined limit value, comprising:
   receiving a modulated input communication signal having signal amplitudes and trajectories which vary below a predetermined limit value;
   determining the amplitude of the input communication signal;
   adjusting input signals having an amplitude less than a predetermined value and providing an amplitude adjusted signal having signal amplitudes less than said predetermined value reduced or eliminated, wherein adjusting the input signals comprises combining a correction signal with the input signal and providing a plurality of different filtering operations on the correction prior to combining with said input signal;

determining the trajectory of said amplitude adjusted signal; and adjusting said amplitude adjusted signals having trajectories less than a predetermined value such that signal trajectories less than said predetermined value are reduced or eliminated.

18. A method for adjusting signal amplitudes and trajectories below a predetermined limit value as set out in claims 17, wherein the input signal comprises a multiple carrier input signal limited to plural frequency bands and wherein the plurality of different filtering operations comprises filtering the correction signal to a plurality of frequency bands corresponding to the spectral bands of said plural carriers prior to combining the correction signal with said input signal.

19. A method for adjusting signal amplitudes and trajectories below a predetermined limit value as set out in claim 17, further comprising adjusting the amplitude of the correction by a plurality of different gain values prior to said plurality of filtering operations.

20. A method for adjusting signal amplitudes and trajectories below a predetermined limit value, comprising:

receiving a modulated input communication signal having signal amplitudes and trajectories which vary below a predetermined limit value;

determining the amplitude of the input communication signal; and adjusting input signals having an amplitude less than a predetermined value and providing an amplitude adjusted signal having signal amplitudes less than said predetermined value reduced or eliminated, wherein adjusting the input signals comprises delaying the input signal and combining a correction signal with the delayed input signal;

determining the trajectory of said amplitude adjusted signal; and adjusting said amplitude adjusted signals having trajectories less than a predetermined value such that signal trajectories less than said predetermined value are reduced or eliminated.

21. A method for adjusting signal amplitudes and trajectories below a predetermined limit value as set out in claim 20, further comprising repeating said adjusting of the signal amplitudes and trajectories a plurality of times to further reduce or eliminate signal amplitudes and trajectories below a predetermined limit value.

22. A method for adjusting signal amplitudes and trajectories below a predetermined limit value, comprising:

receiving a modulated input communication signal having signal amplitudes and trajectories which vary below a predetermined limit value;

determining the amplitude of the input communication signal; and adjusting input signals having an amplitude less than a predetermined value and providing an amplitude adjusted signal having signal amplitudes less than said predetermined value reduced or eliminated, wherein the input signals comprise complex vectors and wherein adjusting the input signals comprises adding a complex correction vector which when added to the input signal results in a signal amplitude at or outside the predetermined value;

determining the trajectory of said amplitude adjusted signal; and adjusting said amplitude adjusted signals having trajectories less than a predetermined value such that signal trajectories less than said predetermined value are reduced or eliminated, wherein the input signals comprise a stream of discrete signal samples and wherein said adjusting trajectories comprises adjusting said signal samples when pairs of consecutive signal samples have connecting vectors crossing within said predetermined value.

23. A method for adjusting signal amplitudes and trajectories below a predetermined limit value, comprising:

receiving a modulated input communication signal having signal amplitudes and trajectories which vary below a predetermined limit value;

determining the amplitude of the input communication signal; and adjusting input signals having an amplitude less than a predetermined value and providing an amplitude adjusted signal having signal amplitudes less than said predetermined value reduced or eliminated, wherein adjusting the input signals comprises combining a correction signal with the input signal and adjusting the amplitude of the correction signal by a gain value prior to combining the correction signal with said input signal;

determining the trajectory of said amplitude adjusted signal; and adjusting said amplitude adjusted signals having trajectories less than a predetermined value such that signal trajectories less than said predetermined value are reduced or eliminated.

24. An envelope elimination and restoration amplifier system, comprising:

an input for receiving a modulated input communication signal having signal amplitudes and trajectories below a predetermined limit value, wherein said input communication signal is band limited to a frequency band;

a zero crossing reduction unit receiving the modulated input communication signal and modifying signal amplitudes and trajectories below a predetermined limit value and providing a modified communication signal with signal amplitudes and trajectories below a predetermined limit value reduced or eliminated, wherein said zero crossing reduction unit comprises a processor for computing a correction signal, a filter for band limiting said correction signal, and a combiner for combining the input communication signal and the correction signal to provide said modified communication signal having amplitudes and trajectories crossing below a predetermined limit value reduced or eliminated;

an envelope elimination circuit for receiving the modified communication signal and converting the modified communication signal to separate gain and phase components; and a power amplifier having a signal input receiving the phase component signal and a power supply input receiving the gain component signal.

25. An envelope elimination and restoration amplifier system as set out in claim 24, further comprising a supply modulation circuit receiving the gain component signal and providing the gain component signal as a modulated power supply input of said power amplifier.

26. An envelope elimination and restoration amplifier system as set out in claim 24, further comprising a frequency converter receiving the phase component signal and providing the frequency converted phase component signal to said signal input of said power amplifier.

27. An envelope elimination and restoration amplifier system as set out in claim 26, wherein said frequency converter comprises a mixer receiving and mixing a high frequency carrier signal with said phase component signal.

28. An envelope elimination and restoration amplifier system as set out in claim 26, wherein said frequency converter comprises a voltage controlled oscillator receiving said phase component signal and outputting a phase modulated high frequency carrier signal.

29. An envelope elimination and restoration amplifier system as set out in claim 24, wherein said input communication signal and said modified communication signal comprise complex quadrature modulated signals and wherein said envelope elimination circuit comprises a rectangular to polar converter circuit.

30. An envelope elimination and restoration amplifier system as set out in claim 24, further comprising first and second digital to analog converters coupled to the phase and gain component signals output from said envelope elimination circuit.

31. An envelope elimination and restoration amplifier system, comprising:

an input for receiving a modulated input communication signal having signal amplitudes and trajectories below a predetermined limit value, wherein said input communication signal is a multi-carrier communication signal band limited to a plurality of frequency bands;

a zero crossing reduction unit receiving the modulated input communication signal and modifying signal amplitudes and trajectories below a predetermined limit value and providing a modified communication signal with signal amplitudes and trajectories below a predetermined limit value reduced or eliminated, wherein said zero crossing reduction unit comprises a processor for computing a correction signal, a plurality of filters for band limiting said correction signal to a corresponding plurality of frequency bands, and a combiner for combining the input communication signal and the correction signal to provide said modified communication signal having amplitudes and trajectories crossing below a predetermined limit value reduced or eliminated;

an envelope elimination circuit for receiving the modified communication signal and converting the modified communication signal to separate gain and phase components; and a power amplifier having a signal input receiving the phase component signal and a power supply input receiving the gain component signal.

32. A method for amplifying a modulated communication signal, comprising:

receiving a communication signal having signal amplitudes and trajectories varying below a predetermined limit value;

adjusting signal amplitudes and trajectories of said modulated communication signal which are below a predetermined limit value to provide a modified communication signal having signal amplitudes and trajectories varying below a predetermined limit value reduced or eliminated, wherein said modulated communication signal is a complex quadrature modulated communication signal comprising a stream of signal samples each having in phase and quadrature values and wherein said adjusting is performed on a sample by sample basis;

converting the modified communication signal to separate gain and phase components;

frequency converting the phase components to provide a phase modulated carrier signal; and amplifying the phase modulated carrier signal with a variable gain controlled by said gain component.

33. A method for amplifying a modulated communication signal as set out in claim 32, wherein converting the modified communication signal to separate gain and phase components comprises converting the complex quadrature modified communication signal to polar coordinates.

34. A method for amplifying a modulated communication signal as set out in claim 32, wherein said adjusting comprises computing a correction value and combining the input communication signal and the correction signal to provide said modified communication signal having amplitudes and trajectories below a predetermined limit value reduced or eliminated.

35. A method for amplifying a modulated communication signal as set out in claim 34, wherein said input communication signal comprises a stream of complex vector sample values and wherein said correction signal comprises a complex vector which when added to a sample adjusts said sample value to avoid amplitudes and trajectories below a predetermined limit value.

36. A method for amplifying a modulated communication signal, comprising:

receiving a communication signal having signal amplitudes and trajectories varying below a predetermined limit value;

adjusting signal amplitudes and trajectories of said modulated communication signal which are below a predetermined limit value to provide a modified communication signal having signal amplitudes and trajectories varying below a predetermined limit value reduced or eliminated, wherein said modulated communication signal is a complex quadrature modulated communication signal comprising a stream of signal samples each having in phase and quadrature values which form a two dimensional region including zero amplitude when plotted over a plurality of time samples and wherein said modified communication signal comprises a stream of signal samples each having in phase and quadrature values which form a two dimensional region having amplitudes and trajectories below a predetermined limit value reduced or eliminated when plotted over a plurality of time samples;

converting the modified communication signal to separate gain and phase components;

frequency converting the chase components to provide a phase modulated carrier signal; and amplifying the phase modulated carrier signal with a variable gain controlled by said gain component.

* * * * *

UNITED STATES PATENT AND TRADEMARK OFFICE
CERTIFICATE OF CORRECTION

PATENT NO.         : 6,931,240 B2                                      Page 1 of 1
APPLICATION NO. : 10/391168
DATED              : August 16, 2005
INVENTOR(S)        : Matthew J. Hunton It is certified that error appears in the above-identified patent and that said Letters Patent is hereby corrected as shown below:

Title Page, Item (73) Assignee: should read as follows: "Santa Ana, California (US)"

Signed and Sealed this

Fifth Day of February, 2008

JON W. DUDAS
*Director of the United States Patent and Trademark Office*